United States Patent
Chang et al.

(10) Patent No.: US 12,406,741 B2
(45) Date of Patent: Sep. 2, 2025

(54) SEMICONDUCTOR MEMORY DEVICES WITH BACKSIDE HEATER STRUCTURE

(71) Applicant: Taiwan Semiconductor Manufacturing Company, Ltd., Hsinchu (TW)

(72) Inventors: Meng-Sheng Chang, Chu-bei (TW); Yao-Jen Yang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 157 days.

(21) Appl. No.: 18/165,635

(22) Filed: Feb. 7, 2023

(65) Prior Publication Data
US 2024/0055062 A1 Feb. 15, 2024

Related U.S. Application Data

(60) Provisional application No. 63/396,699, filed on Aug. 10, 2022.

(51) Int. Cl.
*G11C 17/16* (2006.01)
*H01L 23/48* (2006.01)
(Continued)

(52) U.S. Cl.
CPC .......... *G11C 17/165* (2013.01); *H01L 23/481* (2013.01); *H10B 20/25* (2023.02); *H10D 30/6735* (2025.01); *H10D 62/121* (2025.01)

(58) Field of Classification Search
CPC ....... G11C 17/165; G11C 17/18; G11C 17/16; H01L 23/481; H01L 29/0673;
(Continued)

(56) References Cited

U.S. PATENT DOCUMENTS 9,159,413 B2 10/2015 Le Neel et al.
11,011,578 B2 5/2021 Yun
(Continued)

FOREIGN PATENT DOCUMENTS

CN 1542848 B 1/2011
CN 101393772 B 9/2013
(Continued)

OTHER PUBLICATIONS

Office Action issued in connection with Korean Appl. No. 10-2023-0103451 dated Sep. 6, 2024.
(Continued)

*Primary Examiner* — Mohammed A Bashar
(74) *Attorney, Agent, or Firm* — FOLEY & LARDNER LLP

(57) ABSTRACT

A memory device includes a plurality of one-time-programmable (OTP) memory cells formed as a memory array. Each of the plurality of OTP memory cells includes a transistor and a metal structure electrically coupled to each other in series, and the plurality of OTP memory cells are formed on a first side of a substrate. The memory device includes a heater structure, disposed on a second side of the substrate opposite to the first side, that includes a plurality of interconnect structures. The plurality of interconnect structures are configured to conduct a substantially high current so as to elevate a temperature of the resistor when any of the OTP memory cells is being programmed.

20 Claims, 21 Drawing Sheets

(51) Int. Cl.
  *H10B 20/25* (2023.01)
  *H10D 30/67* (2025.01)
  *H10D 62/10* (2025.01)

(58) Field of Classification Search
  CPC ........... H01L 29/42392; H01L 27/0207; H01L 23/5256; H10B 20/25
  See application file for complete search history.

(56) References Cited

U.S. PATENT DOCUMENTS

| | | | |
|---|---|---|---|
| 2009/0027955 A1 | 1/2009 | Koh et al. | |
| 2009/0065761 A1* | 3/2009 | Chen | H10N 70/8828 257/E47.001 |
| 2011/0057162 A1 | 3/2011 | Breitwisch et al. | |
| 2012/0170352 A1* | 7/2012 | Le Neel | H10N 70/881 257/E45.001 |
| 2015/0043266 A1* | 2/2015 | Youn | G11C 13/0021 365/148 |
| 2020/0135697 A1 | 4/2020 | Brewer | |

FOREIGN PATENT DOCUMENTS

| | | |
|---|---|---|
| JP | H07-297293 A | 11/1995 |
| JP | 2011-003797 A | 1/2011 |
| JP | 2014-049766 A | 3/2014 |
| KR | 10-2008-0020487 A | 3/2008 |
| KR | 10-2015-0033690 A | 4/2015 |

OTHER PUBLICATIONS

Office Action issued in connection with Taiwan Appl. No. 112120730 dated Mar. 12, 2024.

Office Action issued in connection with Korean Appl. No. 10-2023-0103451 dated Apr. 25, 2025.

Office Action on DE 102023106978.0 dated Nov. 12, 2024.

* cited by examiner

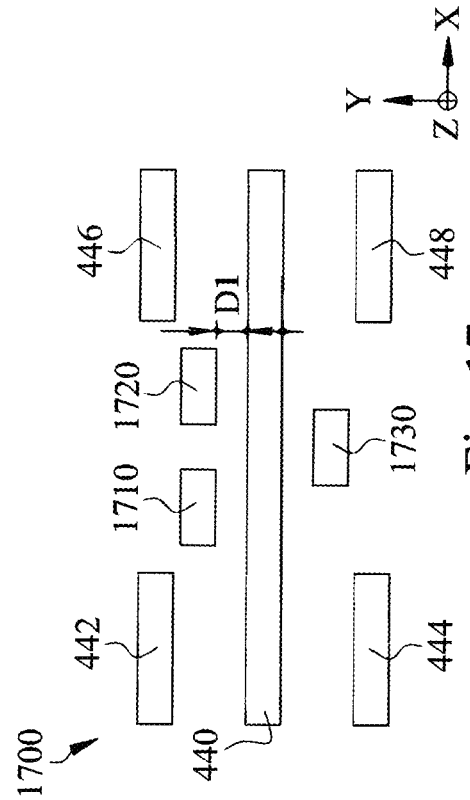
Fig. 15
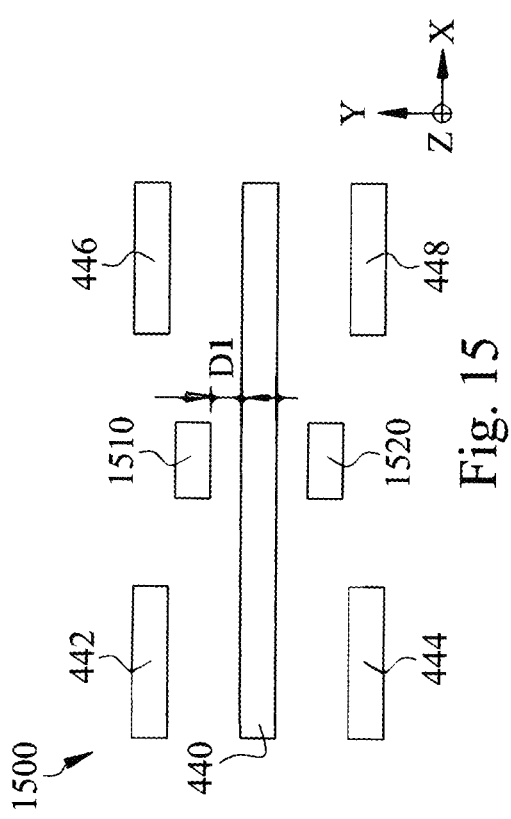
Fig. 17
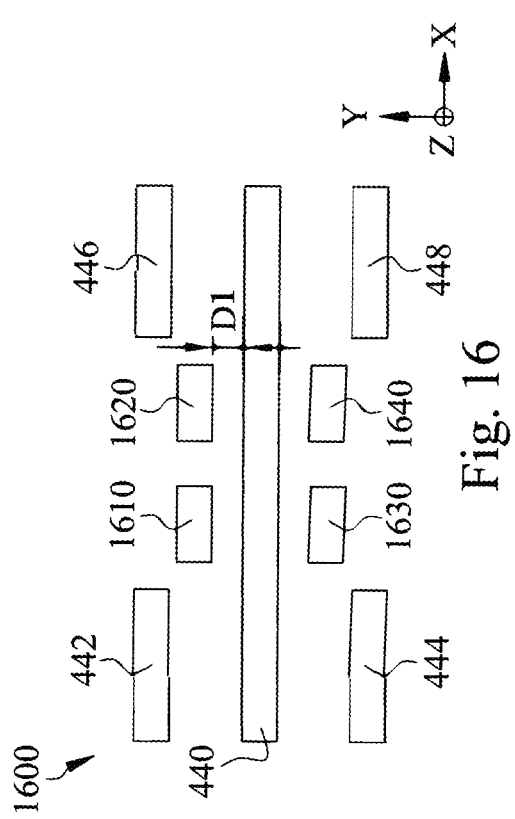
Fig. 16
Fig. 18

SEMICONDUCTOR MEMORY DEVICES WITH BACKSIDE HEATER STRUCTURE

CROSS-REFERENCE TO RELATED APPLICATION

This application claims priority to and the benefit of U.S. Provisional Application No. 63/396,699, filed Aug. 10, 2022, entitled "ELECTRICAL FUSE WITH BACKSIDE POWER RAIL," which is incorporated herein by reference in its entirety for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15 to 18 each illustrate a frontside layout design for fabricating the memory cell of FIG. 3, together with a number of dielectric islands, in accordance with some embodiments.

DETAILED DESCRIPTION

Figure 1:
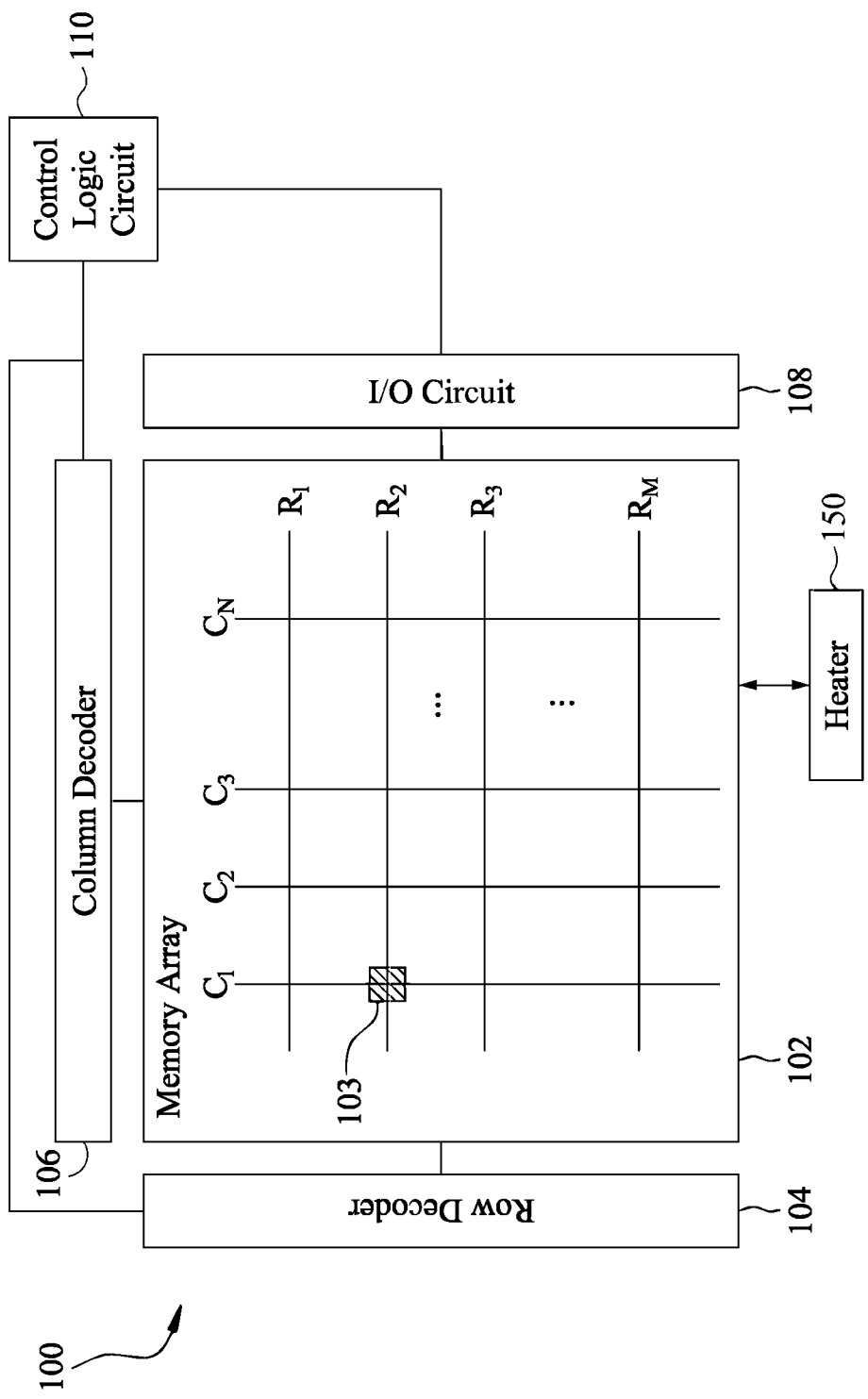
FIG. 1 illustrates a block diagram of an example semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device is one type of the non-volatile memory device utilized in integrated circuits for adjusting the circuitry after fabrication of an integrated circuit. For example, the OTP memory device is used for providing repair information that controls the usage of redundant cells in replacing defective cells of a memory array. Another use is for tuning analog circuitry by trimming a capacitive or resistive value of an analog circuit or enabling and disabling portions of the system. A recent trend is that the same product is likely to be manufactured in different fabrication facilities though in a common process technology. Despite best engineering efforts, it is likely that each facility will have a slightly different process. Usage of OTP memory devices allows independent optimization of the product functionality for each manufacturing facility.

As integrated circuit technology advances, integrated circuit features (e.g., the width of interconnect structures) have been decreasing, thereby allowing for more circuitry to be implemented in an integrated circuit. While implementing OTP memory devices such as, for example, a fuse, an electronic fuse (efuse), etc., in an integrated circuit, it may encounter various challenges. For example, with the decreasing width of interconnect structures, in general, respective dimensions of one or more fuse components of the OTP memory devices shrink accordingly. Given the continuously shrunk dimensions of the fuse components, it can become significantly challenging to program (e.g., burn down) the fuse components. Thus, the existing OTP memory devices have not been entirely satisfactory in many aspects.

The present disclosure provides various embodiments of an OTP memory device that includes a number of efuse memory cells and a heater structure. The heater structure may be electrically isolated from the efuse memory cells, but thermally coupled to the efuse memory cells. For example, the efuse memory cells, each of which includes a transistor and a metal structure (a fuse component) connected in series, may be formed on a frontside of a substrate, while the heater structure, which includes a number of first interconnect structures and a number of second interconnect structures, may be formed on a backside of the substrate. In various embodiments, the first interconnect structures and the second interconnect structures, electrically coupled to one another, can conduct a substantially high current (e.g., in a range from about 10 milliampere (mA) to about 1000 mA) so as to heat up the fuse component on the frontside. Such "heated" fuse component may help to improve programming yield of the efuse memory cells, while keeping dimensions of the fuse component commensurate with the dimensions of various other device features in the advanced technology nodes.

FIG. 1 illustrates an example block diagram of a semiconductor (e.g., memory) device 100, in accordance with various embodiments. In the illustrated embodiment of FIG. 1, the memory device 100 includes a memory array 102, a row decoder 104, a column decoder 106, an input/output (I/O) circuit 108, a control logic circuit 110, and a heater 150. Despite not being explicitly shown in FIG. 1, the components of the memory device 100 may be operatively coupled to each other and to the control logic circuit 110. For example, the heater 150 may be thermally coupled at least to the memory array 102, while the control logic circuit 110, the I/O circuit 108, the column decoder 106, and the row decoder 104 may be electrically coupled to the memory array 102, in some embodiments. Although, in the illustrated example of FIG. 1, the component are shown as separate blocks for the purpose of clear illustration, in some other embodiments, some or all of the components shown in FIG. 1 may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1$, $R_2$, $R_3$ .... $R_M$, each extending in a first direction (e.g., X-direction) and a number of columns $C_1$, $C_2$, $C_3$ .... $C_N$, each extending in a second direction (e.g., Y-direction). Each of the rows/columns may include one or more conductive structures. In some embodiments, each memory cell 103 is arranged in the intersection of a corresponding row and a corresponding column and can be operated according to voltages or currents through the respective conductive structures of the column and row.

In accordance with various embodiments of the present disclosure, each memory cell 103 is implemented as a one-time-programmable (OTP) memory cell, e.g., an efuse memory cell that includes a fuse resistor and an access transistor coupled to each other in series. The access transistor can be coupled to (e.g., gated by) a WL. The access transistor can be turned on/off to enable/disable an access (e.g., program, read) to the corresponding fuse resistor. For example, upon being selected, the access transistor of the selected fuse cell is turned on to generate a program or read path conducting through its fuse resistor and itself. While being programmed, the heater 150, electrically isolated from but thermally coupled to the memory cell 103, can generate heat for at least the fuse resistor by conducting a substantially high current. As such, programming efficiency of the memory cell 103 can be significantly improved. Detailed descriptions on the memory cell 103, configured as a efuse memory cell (herein referred to as efuse cell 103), will be discussed below with respect to FIG. 2.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108).

Figure 2:
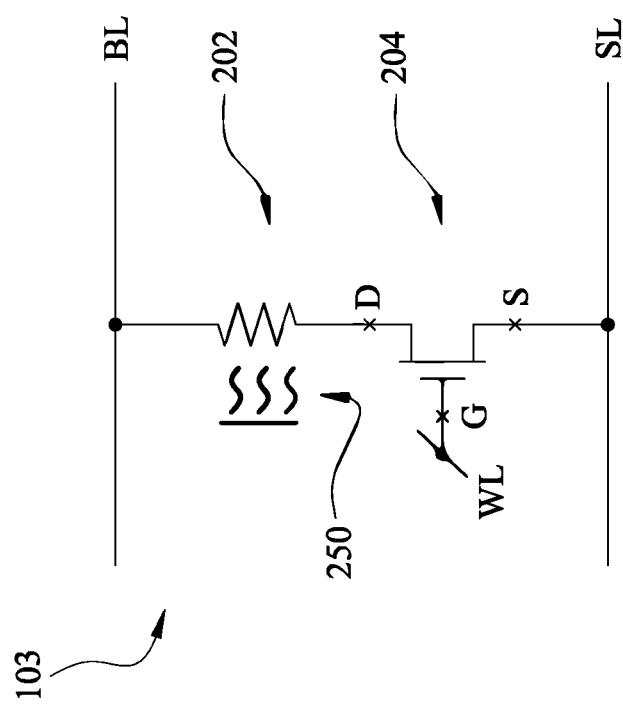
FIG. 2 illustrates an example circuit diagram of a memory cell of the semiconductor device of FIG. 1, in accordance with some embodiments.

FIG. 2 illustrates an example configuration of an efuse memory cell (e.g., 103 of FIG. 1) with improved programming efficiency through being heated up by a heater 250 (e.g., 150 of FIG. 1), in accordance with some embodiments. In the example of FIG. 2, the efuse memory cell 103 is implemented as a one-transistor-1-resistor (1T1R) configuration, for example, a fuse resistor 202 and an access transistor 204 connected to each other in series. It, however, should be understood that any of various other fuse configurations that exhibit the fuse characteristic may be used by the efuse memory cell 103 such as, for example, a 2-diodes-1-resistor (2D1R) configuration, a many-transistors-one-resistor (manyT1R) configuration, etc., while remaining within the scope of the present disclosure.

In accordance with various embodiments of the present disclosure, the fuse resistor 202 and the access transistor 204 are formed on the same side of a substrate, e.g., the frontside of a semiconductor substrate, while the heater 250 is formed on an opposite side of the substrate, e.g., the backside of the semiconductor substrate. For example, the access transistor 204 is formed along the frontside surface of a semiconductor substrate, which is sometimes referred to as part of front-end-of-line (FEOL) processing. Over the FEOL processing, a number of metallization layers, each of which includes a number of interconnect (e.g., metal) structures, are formed, which are sometimes referred to as part of back-end-of-line (BEOL) processing. The fuse resistor 202 may be formed of one or more of the metal structures in one of the metallization layers that are disposed above the access transistor 204. Accordingly, the access transistor 204 and the fuse resistor 202 may be formed through the FEOL processing and BEOL processing (on the frontside), respectively. On the other hand, the heater 250 may be formed of a number of interconnect (e.g., metal) structures disposed above a backside surface of the semiconductor substrate (when flipping the substrate upside down). For purposes of clarity, the metal structure(s) configured as the fuse resistor 202 and the metal structure(s) configured as the heater 250 are herein referred to as frontside metal structure(s) and backside metal structure(s), respectively.

With the fuse resistor 202 of the efuse memory cell 103 embodied as a (frontside) metal structure, the fuse resistor 202 may present an initial resistance value (or resistivity), for example, as fabricated. To program the efuse memory cell 103, the access transistor 204 (if embodied as an n-type transistor) is turned on by applying a (e.g., voltage) signal, corresponding to a logic high state, through a word line (WL) to a gate terminal of the access transistor 204. Concurrently or subsequently, a high enough (e.g., voltage/current) signal is applied on one of the terminals of the fuse resistor 202 through a bit line (BL). With the access transistor 204 turned on, a (e.g., programming) path can be provided from the BL, through the fuse resistor 202 and access transistor 204, and to a source line (SL). Further, prior to, concurrently with, or subsequently to the programming path being formed, the heater 250 can provide heat to the fuse resistor 202, thereby elevating a temperature of at least a portion of the corresponding frontside metal structure (of the fuse resistor 202). With the portion of the frontside metal structure being heated up, the high voltage/current signal can more efficiently burn (or blow) out the frontside metal structure (of the fuse resistor 202). Consequently, the fuse resistor 202 can transition from a first state (e.g., a short circuit) to a second state (e.g., an open circuit), which causes the efuse memory cell 103 to irreversibly transition from a first logic state (e.g., logic 0) to a second logic state (e.g., logic 1). The logic state can be read out by applying a relatively low voltage signal on the BL and turning on the access transistor 204 to provide a (e.g., reading) path.

Figure 3:
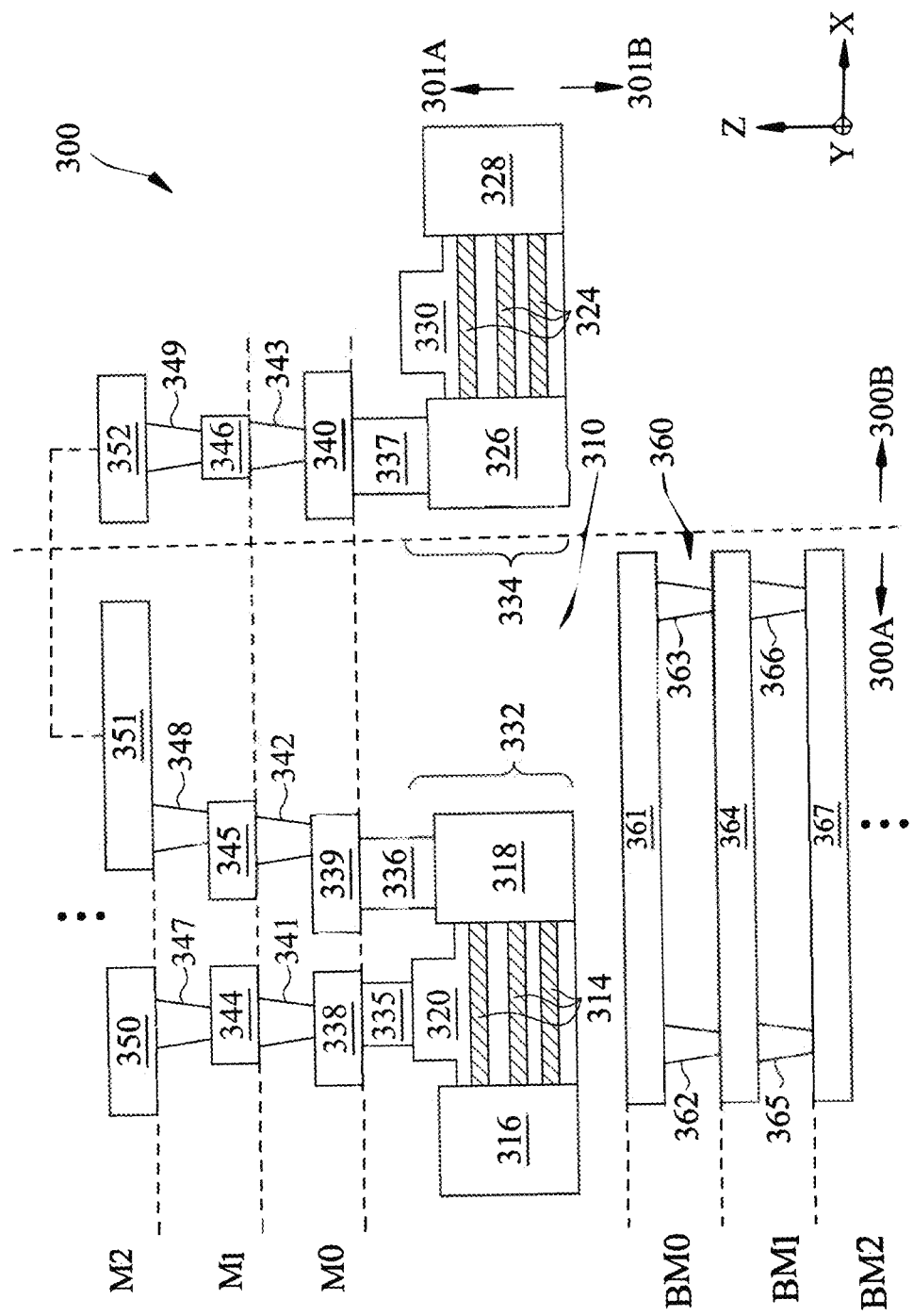
FIG. 3 illustrates a cross-sectional view of an example memory cell thermally coupled with a heater, in accordance with some embodiments.

FIG. 3 illustrates a cross-sectional view of an example semiconductor device 300 including an efuse memory cell 310 (e.g., 103) and a heater 360 (e.g., 150/250) thermally coupled to each other, in accordance with various embodiments. The efuse memory cell 310 includes a fuse resistor and an access transistor connected to each other in series that are formed on the frontside 301A of a substrate (not explicitly shown in FIG. 3), while the heater 360 includes a number of metal structures formed on a backside 301B of the substrate. The cross-sectional view of FIG. 3 is cut along the lengthwise direction of a channel of the access transistor of the efuse memory cell 310 (e.g., the X direction). The access transistor may be implemented as a gate-all-around (GAA) field-effect-transistor (FET) device, in some embodiments. However, it should be understood that the access transistor can be implemented as any of various other types of transistor structures, while remaining within the scope of the present disclosure. FIG. 3 is simplified to illustrate relatively spatial configurations of the above-discussed structures, and thus, it should be understood that one or more features/structures of a completed GAA FET device may not be displayed for clarity.

On the frontside 301A, the semiconductor device 300 includes an active region (sometimes referred to as an oxide diffusion region) having portions being formed as a number of channels, e.g., 314 and 324, and portions being formed as source/drain structures, e.g., 316, 318, 326, and 328. The channels 314 and 324 each include one or more nanostructures (e.g., nanosheets, nanowires) vertically spaced apart from each other. The semiconductor device 300 includes a number of (e.g., metal) gate structures, e.g., 320 and 330, each of which wraps around the nanostructures of a corresponding channel. For example, the gate structure 320 wraps around each of the nanostructures of the channel 314; and the gate structure 330 wraps around each of the nanostructures of the channel 324. Further, each channel is connected to one or more source/drain structures so as to form a transistor (e.g., a GAA FET). For example, the channel 314, gate structure 320 (wrapping around the channel 314), and source/drain structures 316-318 (connected to the channel 314) form a first transistor 332; and the channel 324, gate structure 330 (wrapping around the channel 324), and source/drain structures 326-328 (connected to the channel 324) form a second transistor 334.

Over the transistors on the frontside 301A, a number of middle-end interconnect (e.g., metal) structures can be formed, and each of the middle-end interconnect structures can provide an electrical connection path for a corresponding gate structure or source/drain structure. For example, the semiconductor device 300 includes middle-end interconnect structures 335, 336, and 337. The middle-end interconnect structure 335 is formed as a via structures and in electrical contact with the gate structure 320 (which is sometimes referred to as "VG"), and the middle-end interconnect structures 336 and 337 are in electrical contact with the source/drain structures 318 and 326, respectively (which are sometimes referred to as "MDs").

Over the middle-end interconnect structures (e.g., VG, MD), the semiconductor device 300 includes a number of frontside metallization layers. Each of the frontside metallization layers includes a number of back-end interconnect structures, metal lines and via structures, embedded in a corresponding dielectric material (e.g., an inter-metal dielectric (IMD)). For example, the semiconductor device 300 includes frontside metallization layers, M0, M1, and M2. Although three frontside metallization layers are shown, it should be understood that the semiconductor device 300 can include any number of frontside metallization layers while remaining within the scope of the present disclosure.

The frontside metallization layer M0 includes metal lines 338, 339, and 340 (which are sometimes referred to as "M0 tracks"), and via structures 341, 342, and 343 (which are sometimes referred to as "V0"); the frontside metallization layer M1 includes metal lines 344, 345, and 346 (which are sometimes referred to as "M1 tracks"), and via structures 347, 348, and 349 (which are sometimes referred to as "V1"); and the frontside metallization layer M2 includes metal lines 350, 351, and 352 (which are sometimes referred to as "M2 tracks"). The VG 335 can allow the gate structure 320 to be in electrical contact with the M2 track 350 through the M0 track 338, V0 341, M1 track 344, and V1 347; the MD 336 can allow the source/drain structure 318 to be in electrical contact with the M2 track 351 through the M0 track 339, V0 342, M1 track 345, and V1 348; and the MD 337 can allow the source/drain structure 326 to be in electrical contact with the M2 track 352 through the M0 track 340, V0 343, M1 track 346, and V1 349.

In the example of FIG. 3, the first transistor 332 can operatively serve as the access transistor of the efuse memory cell 310 (e.g., an implementation of the access transistor 204 of FIG. 2), the M2 track 351 can operatively serve as the fuse resistor of the efuse memory cell 310 (e.g., an implementation of the fuse resistor 202 of FIG. 2), and the second transistor 334 can operatively serve as a switch/selection transistor coupled to the efuse memory cell 310. Specifically, the M2 track 351 has a first end in electrical connection with the first transistor 332, and a second end in electrical connection with a bit line (e.g., the BL of FIG. 2) which may be embodied as a metal line in one of other higher frontside metallization layers. In response to the first transistor 332 being activated, the second transistor 334 can be activated to couple a programming voltage or reading voltage to the M2 track 351 (the fuse resistor 202) through the bit line. Referring again to the block diagram of FIG. 1, a plural number of such efuse memory cells (e.g., 310) can form the memory array of a memory device (e.g., 102), while a plural number of such switch/selection transistors (e.g., 334) can form the I/O circuit of a memory device (e.g., 108). In some embodiments of the present disclosure, the memory array may be formed in a first region of the substrate (e.g., 300A), while the I/O circuit may be formed in a second region of the substrate (e.g., 300B). The second region 300B (sometimes referred to as a peripheral region) can be configured as a close-end or an open-end ring surrounding the first region 300A (sometimes referred to as a memory region).

On the backside 301B, the semiconductor device 300 includes a number of backside metallization layers. Each of the backside metallization layers includes a number of back-end interconnect structures, metal lines and via structures, embedded in a corresponding dielectric material (e.g., an inter-metal dielectric (IMD)). For example, the semiconductor device 300 includes backside metallization layers, BM0, BM1, and BM2. Although three backside metallization layers are shown, it should be understood that the semiconductor device 300 can include any number of backside metallization layers while remaining within the scope of the present disclosure.

The backside metallization layer BM0 includes metal line 361 (which is sometimes referred to as "BM0 track"), and via structures 362 and 363 (which are sometimes referred to as "BV0s"); the backside metallization layer BM1 includes metal line 364 (which is sometimes referred to as "BM1 track"), and via structures 365 and 366 (which are sometimes referred to as "BV1s"); and the backside metallization layer BM2 includes metal line 367 (which is sometimes referred to as "BM2 track").

In the example of FIG. 3, at least some of the metal lines and via structures formed across the backside metallization layers can operatively serve as the heater 360 (e.g., an implementation of the heater 250 of FIG. 2). In various embodiments, the heater 360 may be electrically isolated from the frontside features (e.g., the efuse memory cell 310), but thermally coupled to the efuse memory cell 310. As such, the heater 360 can provide heat to the efuse memory cell 310 (e.g., M2 track/efuse resistor 351) from the backside by conducting a substantially high level of current (e.g., in a range from about 10 mA to about 1000 mA). For example, the metal lines and via structures of the heater 360 can collectively conduct such a high level of current to heat the M2 track/efuse resistor 351, when the M2 track/efuse resistor 351 is being programmed (e.g., burned out).

Figure 4:
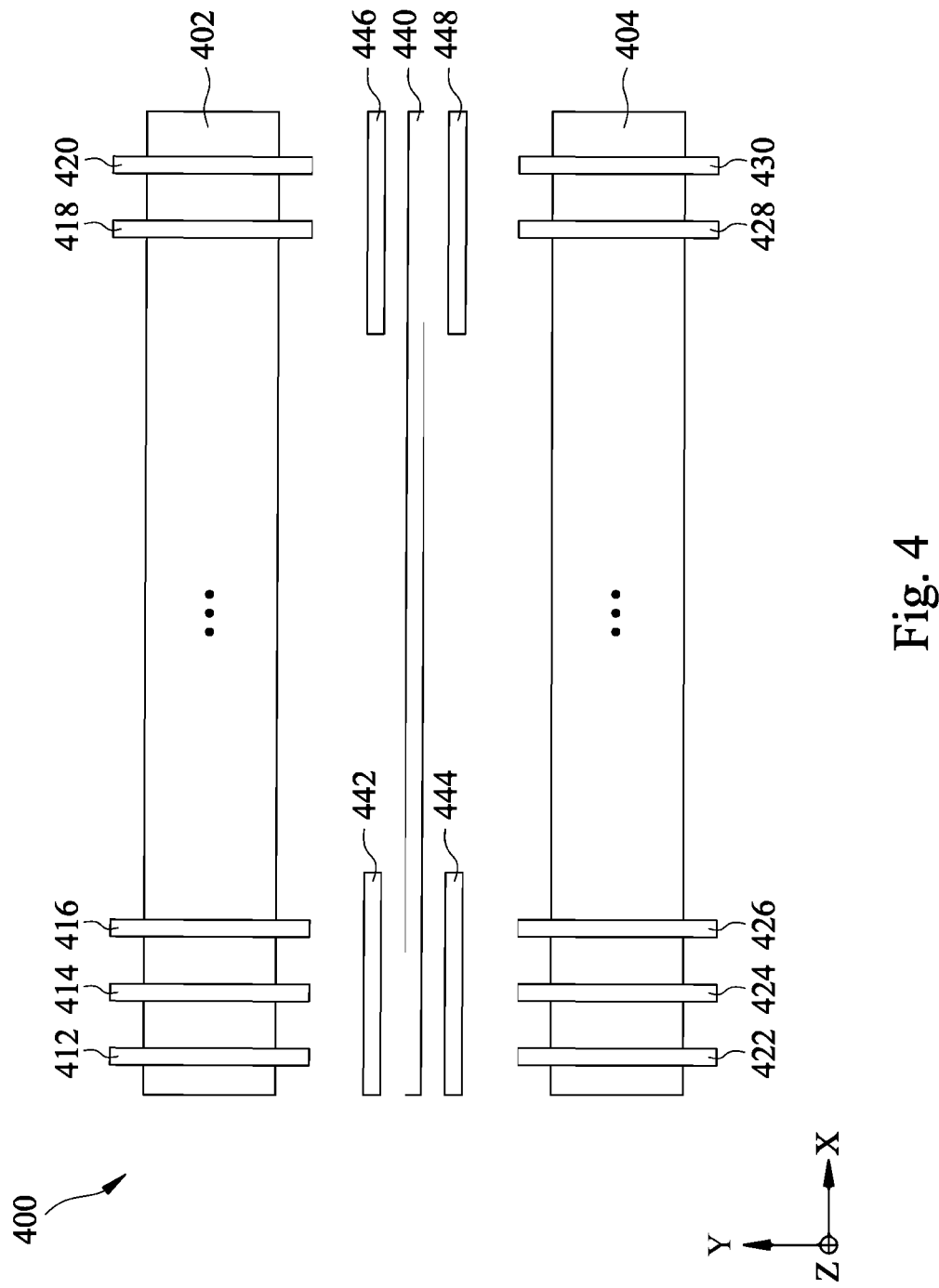
FIG. 4 illustrates a frontside layout design for fabricating the memory cell of FIG. 3, in accordance with some embodiments.

FIG. 4 illustrates an example frontside layout 400 configured to form the disclosed efuse memory cell (e.g., 310 of FIG. 3), in accordance with various embodiments. The efuse memory cell, as disclosed herein, is formed of an access transistor and a fuse resistor connected to each other in series. The access transistor can be constructed by a number (e.g., 100) of sub-transistors, which can be coupled to one another in parallel. The fuse resistor can be constructed by at least a frontside metal structure disposed over those sub-transistors on the frontside of a substrate. Further, FIGS. 5, 6, 7, 8, 9, 10, 11, 12, 13, and 14 illustrate example backside layouts 500, 600, 700, 800, 900, 1000, 1100, 1200, 1300, and 1400, respectively, in accordance with various embodiments. Each of the backside layouts 500 to 1400 is configured to form the disclosed heater (e.g., 360 of FIG. 3) thermally coupled to the efuse memory cell formed based on the layout 400. The heater, as disclosed herein, can be constructed by a number of backside metal structures.

Referring first to FIG. 4, the frontside layout 400 includes patterns 402 and 404 that are each configured to form an active region (hereinafter "active region 402," and "active region 404," respectively); and patterns 412, 414, 416, 418, 420, 422, 424, 426, 428, and 430 that are each configured to form a gate structure (hereinafter "gate structure 412," "gate structure 414," "gate structure 416," "gate structure 418," "gate structure 420," "gate structure 422," "gate structure 424," "gate structure 426," "gate structure 428," and "gate structure 430," respectively). It should be understood that the frontside layout 400 can include any number of the active regions and gate structures, while remaining within the scope of present disclosure.

The active regions 402 to 404 may extend along a first lateral direction (e.g., X-direction), while the gate structures 412 to 430 may extend along a second, different lateral direction (e.g., Y-direction). Further, the gate structures 412 to 420 can each traverse the active region 402, and the gate structures 422 to 430 can each traverse the active region 404. In various embodiments, each of the active regions 402 to 404 is formed of a stack structure protruding from the frontside surface of a substrate. The stack includes a number of semiconductor nanostructures (e.g., nanosheets) extending along the X-direction and vertically separated from each other. Portions of the semiconductor structures in the stack that are overlaid by the gate structure remain, while other portions are replaced with a number of epitaxial structures. The remaining portions of the semiconductor structures can be configured as the channel of a corresponding transistor (or sub-transistor), the epitaxial structures coupled to both sides (or ends) of the remaining portions of the semiconductor structures can be configured as source/drain structures (or terminals) of the transistor (or sub-transistor), and a portion of the gate structure that overlays (e.g., straddles) the remaining portions of the semiconductor structures can be configured as a gate structures (or terminal) of the transistor (or sub-transistor).

For example in FIG. 4, the portion of the active region 402 that is overlaid by the gate structure 412 may include a number of nanostructures vertically separated from each other, which can function as the channel of a sub-transistor. The portions of the active region 402 that are disposed on opposite sides of the gate structure portion 412 are replaced with epitaxial structures. Such epitaxial structures can function as source/drain terminals ("S" and "D" of FIG. 2) of the sub-transistor. The gate structure 412 can function as a gate terminal ("G" of FIG. 2) of sub-transistor. Thus, it should be appreciated that the frontside layout 400 can be used to fabricate a certain number of such sub-transistors. In some embodiments, such sub-transistors, formed based on the patterns 402-404 and 412-430, can be electrically coupled to each other in parallel to collectively function as the access transistor of an efuse memory cell (e.g., 310 of FIG. 3).

The frontside layout 400 further includes patterns 440, 442, 444, 446, and 448 that are each configured to form a metal structure (hereinafter "metal structure 440," "metal structure 442," "metal structure 444," "metal structure 446," and "metal structure 448," respectively). The metal structures 440 to 448 may extend along the first lateral direction (e.g., X-direction), with the metal structure 440 being the longest one to have a length about the same as a length of the active regions (along the X-direction) and with the rest of metal structures 442 to 448 being shorter and offset from the metal structure 440 along the Y-direction. The metal structures 440 to 448 may each be formed as a metal line disposed in an M2 metallization layer (FIG. 3), e.g., an M2 track. Stated another way, between the gate structures 412 to 430 and the metal structures 440 to 448, there can be a number of other patterns, some of which can be utilized to form M0 tracks and some of which can be utilized to form M1 tracks. Such M0 and M1 tracks are not displayed in FIG. 4 for clarity purposes. In some embodiments, the metal structure 440 can function as the fuse resistor of the efuse memory cell (e.g., 351 of FIG. 3).

Referring then to FIGS. 5 to 14, each of the backside layouts 500 to 1400 includes two sets of patterns. One set of the patterns are configured to form a number of metal structures disposed in a BM0 metallization layer (FIG. 3), e.g., BM0 tracks, and the other set of the patterns are configured to form a number of metal structures disposed in a BM1 metallization layer (FIG. 3), e.g., BM1 tracks. The BM1 tracks are generally located above the BM0 tracks, with upside being down (as illustrated in FIG. 3). In various embodiments, these BM0 tracks and BM1 tracks can operatively serve as the disclosed heater that is thermally coupled to an efuse memory cell formed based on the frontside layout 400 (e.g., 360 of FIG. 3). Although two sets of patterns are shown in the examples of FIGS. 5-14, it should be understood that the disclosed heater can be formed by any number of sets of patterns (i.e., the metal structures disposed across any number of backside metallization layers) while remaining within the scope of the present disclosure. As a reference, the active regions 402 and 404 (configured to partially form the access transistor) and metal structure 440 (configured to form the fuse resistor), formed on the frontside (FIG. 4), are also shown in each of the backside layouts 500 to 1400.

Figure 5:
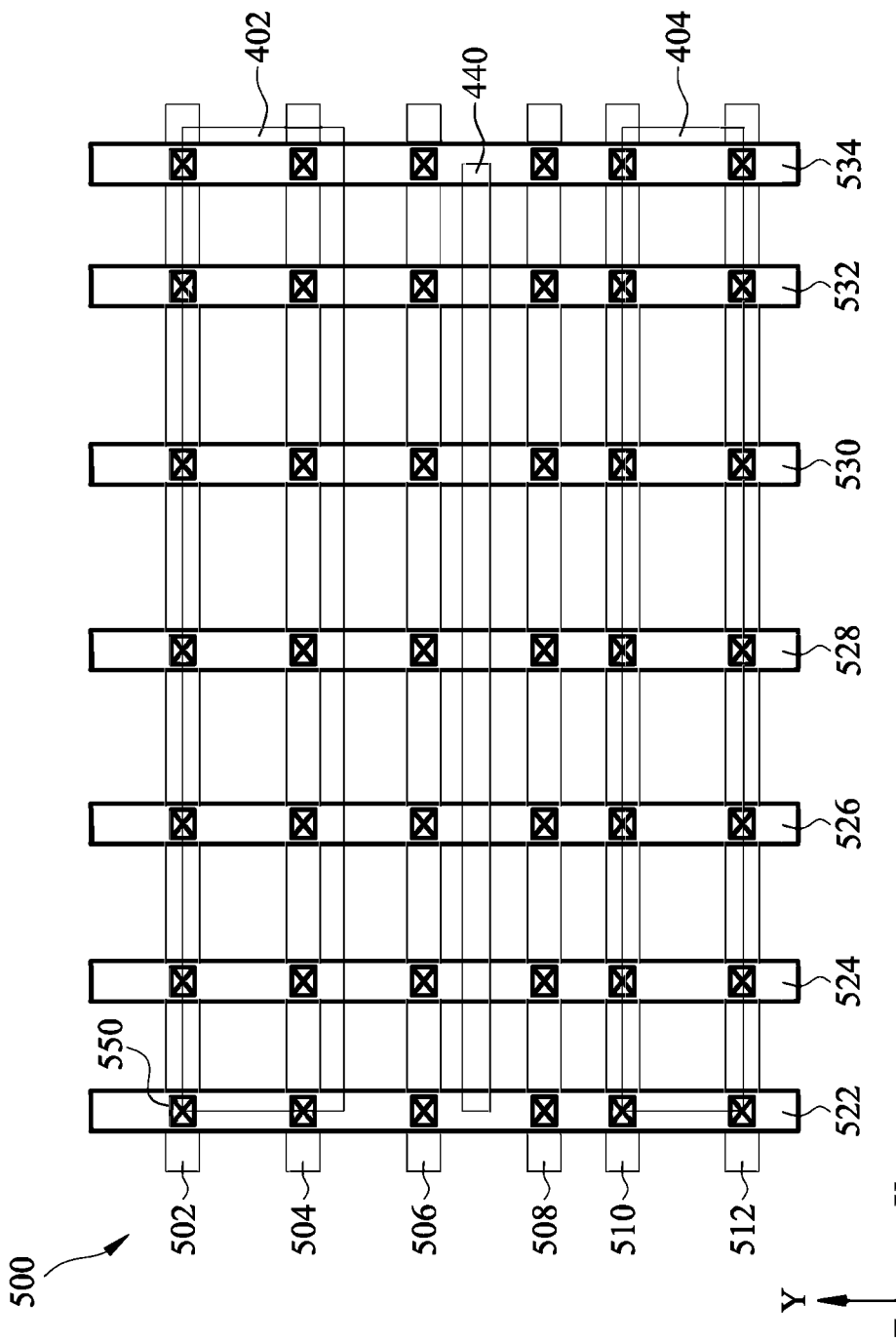
FIGS. 5 to 14 each illustrate a backside layout design for fabricating the heater of FIG. 3, in accordance with some embodiments.

In FIG. 5, the layout 500 includes a first set of patterns, 502, 504, 506, 508, 510, and 512, and a second set of patterns, 522, 524, 526, 528, 530, 532, and 534. The first set of patterns 502 to 512 are each configured to form a BM0 track (hereinafter "BM0 track 502," "BM0 track 504," "BM0 track 506," "BM0 track 508," "BM0 track 510," and "BM0 track 512," respectively); and the second set of patterns 522 to 534 are each configured to form a BM1 track (hereinafter "BM1 track 522," "BM1 track 524," "BM1 track 526," "BM1 track 528," "BM1 track 530," "BM1 track 532," and "BM1 track 534," respectively). As shown, all the BM0 tracks 502 to 512 extend along the X direction, and all the BM1 tracks 522 to 534 extend along the Y direction. The BM0 tracks 502 to 512 and the BM1 tracks 522 to 534 can form a mesh structure. Although such a mesh structure is formed across the entire piece of the metal structure 440 (the fuse resistor) in the example of FIG. 5, it should be understood that the mesh structure can be confined around a certain portion of the metal structure 440 (e.g., around a central portion of the metal structure 440) while remaining within the scope of the present disclosure. The BM0 tracks 502 to 512 are electrically coupled to the BM1 tracks 522 to 534 through a number of via structures (e.g., 550). Accordingly, the BM0 tracks 502 to 512 and BM1 tracks 522 to 534 can collectively conduct a substantially high current to heat up the fuse resistor formed on the frontside.

Figure 6:
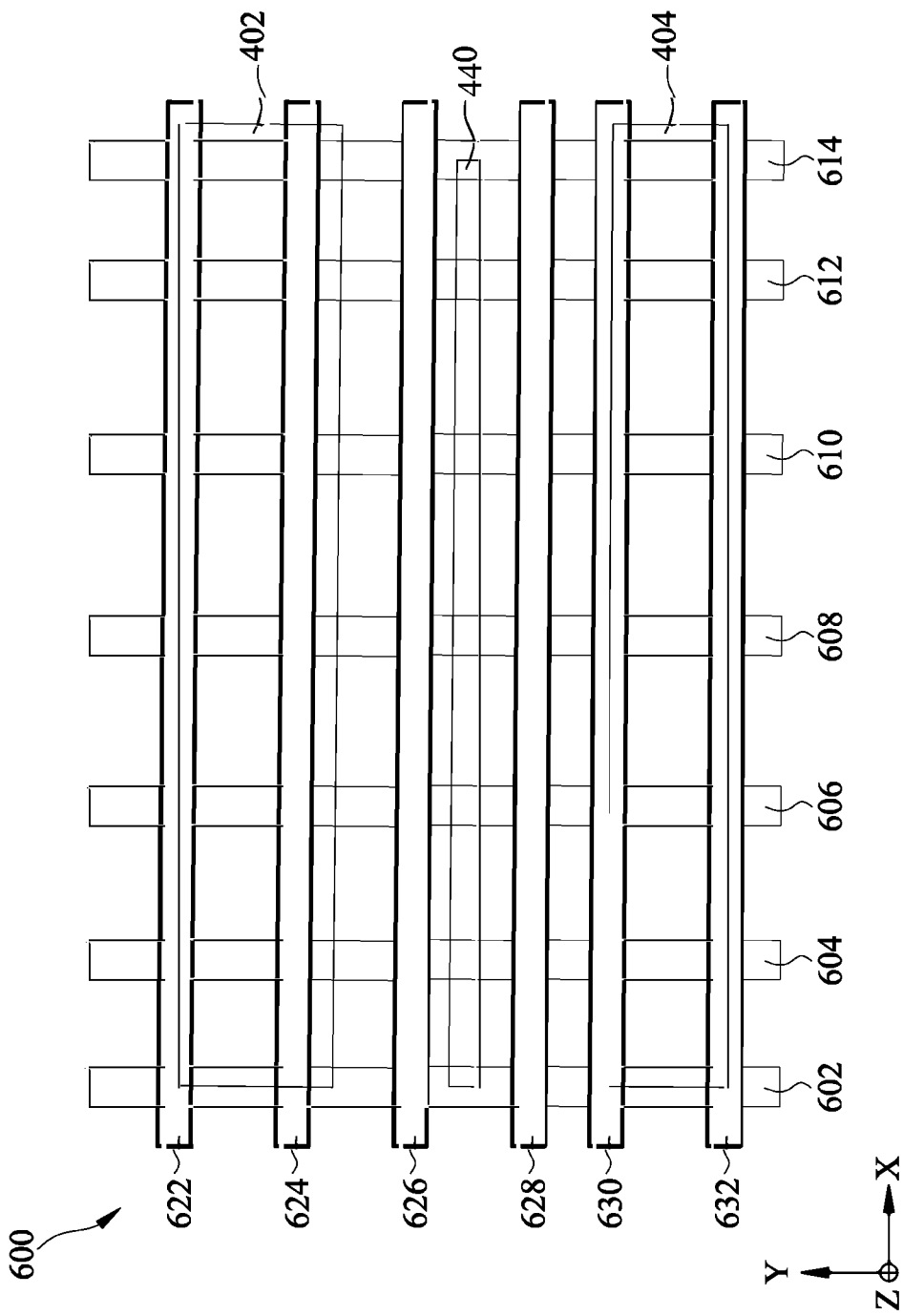

In FIG. 6, the layout 600 includes a first set of patterns, 602, 604, 606, 608, 610, 612, and 614, and a second set of patterns, 622, 624, 626, 628, 630, and 632. The first set of patterns 602 to 614 are each configured to form a BM0 track (hereinafter "BM0 track 602," "BM0 track 604," "BM0 track 606," "BM0 track 608," "BM0 track 610," "BM0 track 612," and "BM0 track 614," respectively); and the second set of patterns 622 to 632 are each configured to form a BM1 track (hereinafter "BM1 track 622," "BM1 track 624," "BM1 track 626," "BM1 track 628," "BM1 track 630," and "BM1 track 632," respectively). As shown, all the BM0 tracks 602 to 614 extend along the Y direction, and all the BM1 tracks 622 to 632 extend along the X direction. The BM0 tracks 602 to 614 and the BM1 tracks 622 to 632 can form a mesh structure. Although such a mesh structure is formed across the entire piece of the metal structure 440 (the fuse resistor) in the example of FIG. 6, it should be understood that the mesh structure can be confined around a certain portion of the metal structure 440 (e.g., around a central portion of the metal structure 440) while remaining within the scope of the present disclosure. The BM0 tracks 602 to 614 are electrically coupled to the BM1 tracks 622 to 632 through a number of via structures (similar to via structures 550 of FIG. 5, which are not displayed in FIG. 6 for clarity). Accordingly, the BM0 tracks 602 to 614 and BM1 tracks 622 to 632 can collectively conduct a substantially high current to heat up the fuse resistor formed on the frontside.

Figure 7:
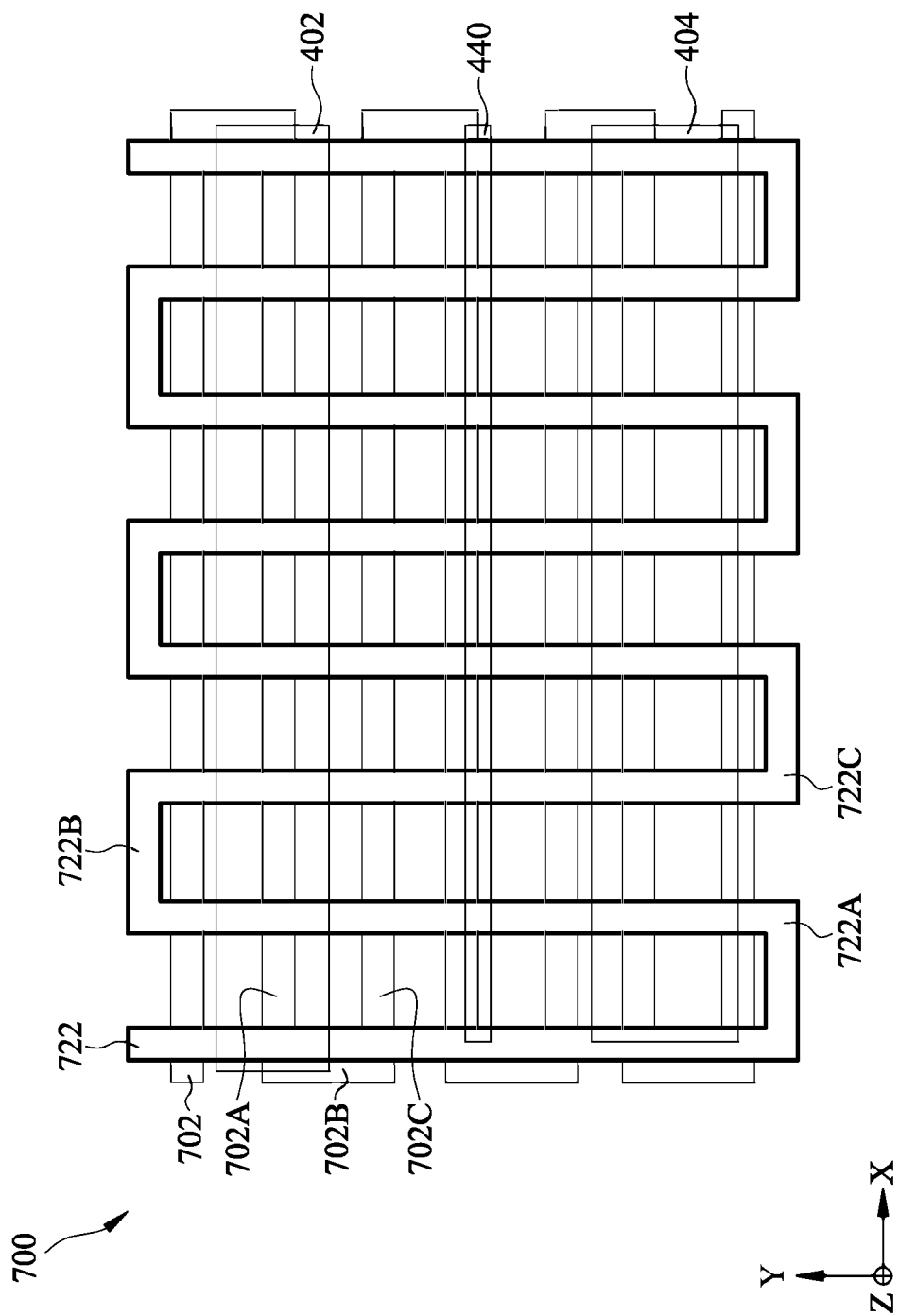

In FIG. 7, the layout 700 includes a first set of patterns forming a first continuous structure 702, and a second set of patterns forming a second continuous structure 722. The first continuous structure 702 is configured to form a BM0 track (hereinafter "BM0 track 702"); and the second continuous structure 722 is configured to form a BM1 track (hereinafter "BM1 track 722"). As shown, the BM0 track 702 has a number of first portions (patterns) extending along the X direction (e.g., 702A, 702C) and a number of second portions (patterns) extending along the Y direction (e.g., 702B), and the BM1 track 722 has a number of first portions (patterns) extending along the X direction (e.g., 722B) and a number of second portions (patterns) extending along the Y direction (e.g., 722A, 722C). Further, each of the second portions of the BM0 track 702 (e.g., 702B) has its two ends connected to a pair of the first portions of the BM0 track 702 (e.g., 702A and 702C); and each of the first portions of the BM1 track 722 (e.g., 722B) has its two ends connected to a pair of the second portions of the BM1 track 722 (e.g., 722A and 722C). Although a combination of the BM0 track 702 and BM1 track 722 is formed across the entire piece of the metal structure 440 (the fuse resistor) in the example of FIG. 7, it should be understood that the combination can be confined around a certain portion of the metal structure 440 (e.g., around a central portion of the metal structure 440) while remaining within the scope of the present disclosure. The BM0 track 702 is electrically coupled to the BM1 track 722 through a number of via structures (similar to via structures 550 of FIG. 5, which are not displayed in FIG. 7 for clarity). Accordingly, the BM0 track 702 and BM1 track 722 can collectively conduct a substantially high current to heat up the fuse resistor formed on the frontside.

Figure 8:
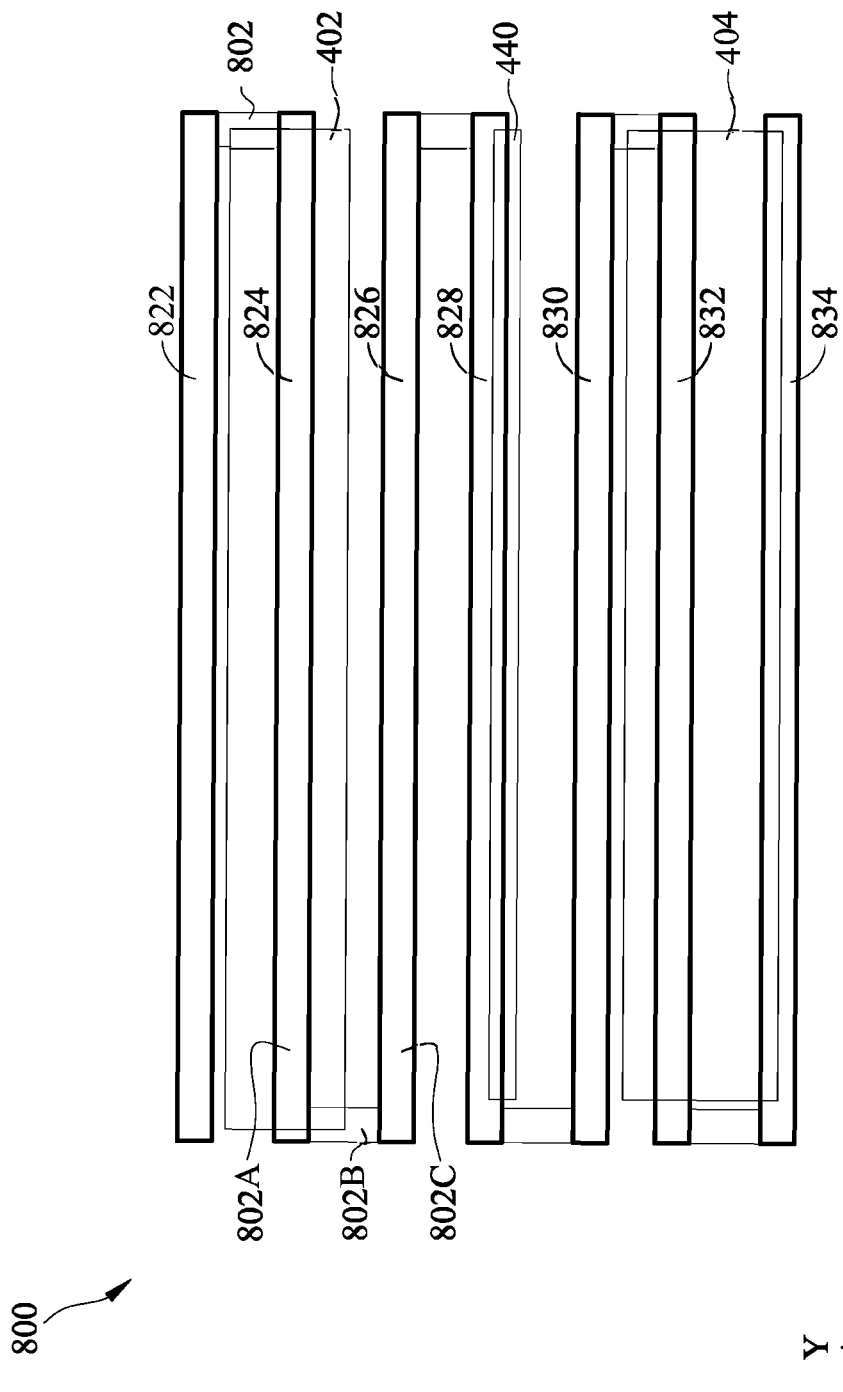

In FIG. 8, the layout 800 includes a first set of patterns forming a first continuous structure 802, and a second set of patterns, 822, 824, 826, 828, 830, 832, and 834. The first continuous structure 802 is configured to form a BM0 track (hereinafter "BM0 track 802"); and the second set of patterns 822 to 834 are each configured to form a BM1 track (hereinafter "BM1 track 822," "BM1 track 824," "BM1 track 826," "BM1 track 828," "BM1 track 830," "BM1 track 832" and "BM1 track 834," respectively). As shown, the BM0 track 802 has a number of first portions (patterns) extending along the X direction (e.g., 802A, 802C) and a number of second portions (patterns) extending along the Y direction (e.g., 802B), while the BM1 tracks 822 to 834 extend along the X direction. Further, each of the second portions of the BM0 track 802 (e.g., 802B) has its two ends connected to a pair of the first portions of the BM0 track 802 (e.g., 802A and 802C). Although a combination of the BM0 track 802 and BM1 tracks 822 to 834 is formed across the entire piece of the metal structure 440 (the fuse resistor) in the example of FIG. 8, it should be understood that the combination can be confined around a certain portion of the metal structure 440 (e.g., around a central portion of the metal structure 440) while remaining within the scope of the present disclosure. The BM0 track 802 is electrically coupled to the BM1 tracks 822 to 834 through a number of via structures (similar to via structures 550 of FIG. 5, which are not displayed in FIG. 8 for clarity). Accordingly, the BM0 track 802 and BM1 tracks 822 to 834 can collectively conduct a substantially high current to heat up the fuse resistor formed on the frontside.

Figure 9:
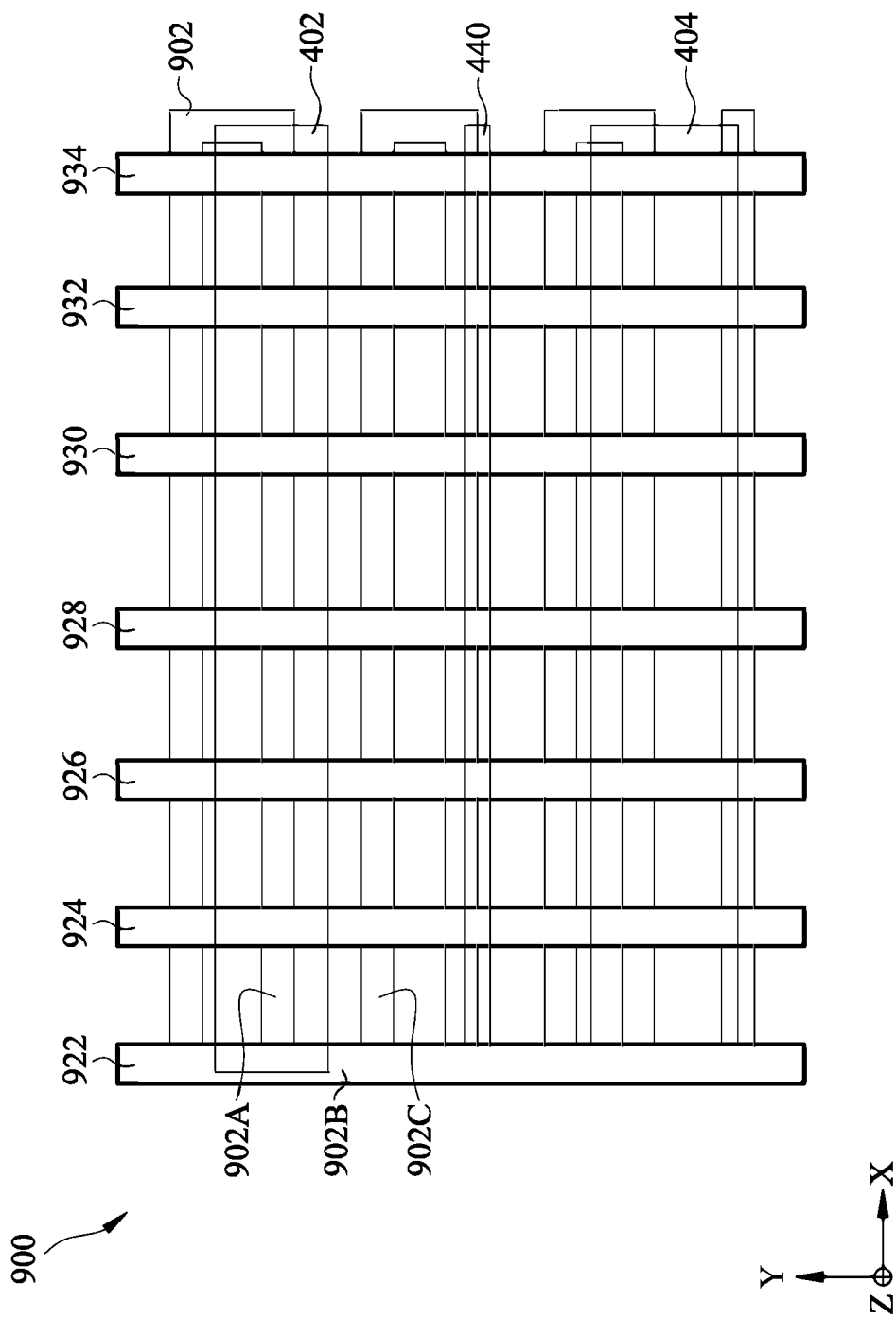

In FIG. 9, the layout 900 includes a first set of patterns forming a first continuous structure 902, and a second set of patterns, 922, 924, 926, 928, 930, 932, and 934. The first continuous structure 902 is configured to form a BM0 track (hereinafter "BM0 track 902"); and the second set of patterns 922 to 934 are each configured to form a BM1 track (hereinafter "BM1 track 922," "BM1 track 924," "BM1 track 926," "BM1 track 928," "BM1 track 930," "BM1 track 932" and "BM1 track 934," respectively). As shown, the BM0 track 902 has a number of first portions (patterns) extending along the X direction (e.g., 902A, 902C) and a number of second portions (patterns) extending along the Y direction (e.g., 902B), while the BM1 tracks 922 to 934 extend along the Y direction. Further, each of the second portions of the BM0 track 902 (e.g., 902B) has its two ends connected to a pair of the first portions of the BM0 track 902 (e.g., 902A and 902C). Although a combination of the BM0 track 902 and BM1 tracks 922 to 934 is formed across the entire piece of the metal structure 440 (the fuse resistor) in the example of FIG. 9, it should be understood that the combination can be confined around a certain portion of the metal structure 440 (e.g., around a central portion of the metal structure 440) while remaining within the scope of the present disclosure. The BM0 track 902 is electrically coupled to the BM1 tracks 922 to 934 through a number of via structures (similar to via structures 550 of FIG. 5, which are not displayed in FIG. 9 for clarity). Accordingly, the BM0 track 902 and BM1 tracks 922 to 934 can collectively conduct a substantially high current to heat up the fuse resistor formed on the frontside.

Figure 10:
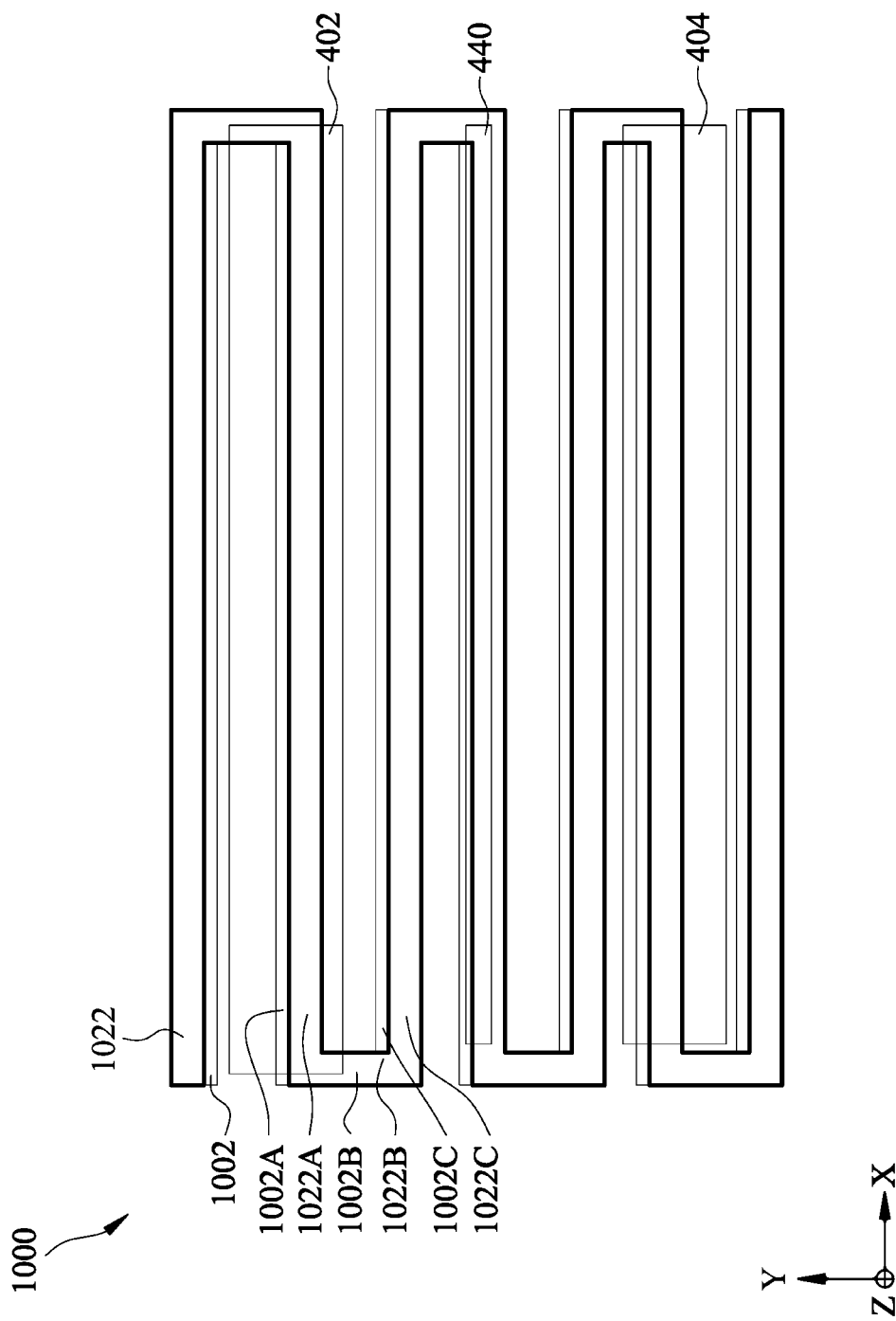

In FIG. 10, the layout 1000 includes a first set of patterns forming a first continuous structure 1002, and a second set of patterns forming a second continuous structure 1022. The first continuous structure 1002 is configured to form a BM0 track (hereinafter "BM0 track 1002"); and the second continuous structure 1022 is configured to form a BM1 track (hereinafter "BM1 track 1022"). As shown, the BM0 track 1002 has a number of first portions (patterns) extending along the X direction (e.g., 1002A, 1002C) and a number of second portions (patterns) extending along the Y direction (e.g., 1002B), and the BM1 track 1022 has a number of first portions (patterns) extending along the X direction (e.g., 1022A, 1022C) and a number of second portions (patterns) extending along the Y direction (e.g., 1022B). Further, each of the second portions of the BM0 track 1002 (e.g., 1002B) has its two ends connected to a pair of the first portions of the BM0 track 1002 (e.g., 1002A and 1002C); and each of the second portions of the BM1 track 1022 (e.g., 1022B) has its two ends connected to a pair of the second first portions of the BM1 track 1022 (e.g., 1022A and 1022C). In some embodiments, the BM0 track 1002 and BM1 track 1022 can be laterally aligned with each other. In some other embodiments, however, the BM0 track 1002 and BM1 track 1022 can be laterally offset from each other. Although a combination of the BM0 track 1002 and BM1 track 1022 is formed across the entire piece of the metal structure 440 (the fuse resistor) in the example of FIG. 10, it should be understood that the combination can be confined around a certain portion of the metal structure 440 (e.g., around a central portion of the metal structure 440) while remaining within the scope of the present disclosure. The BM0 track 1002 is electrically coupled to the BM1 track 1022 through a number of via structures (similar to via structures 550 of FIG. 5, which are not displayed in FIG. 10 for clarity). Accordingly, the BM0 track 1002 and BM1 track 1022 can collectively conduct a substantially high current to heat up the fuse resistor formed on the frontside.

Figure 11:
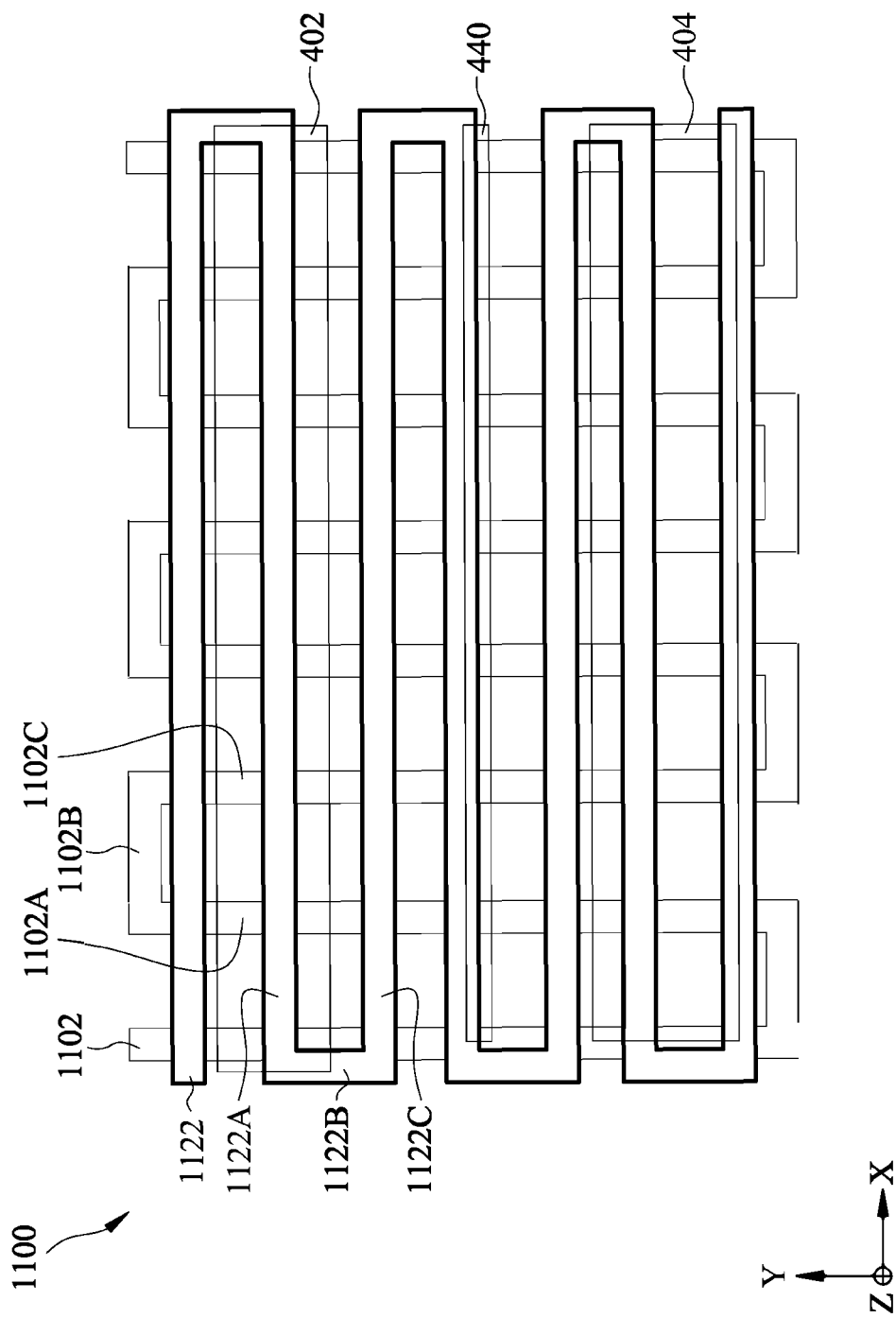

In FIG. 11, the layout 1100 includes a first set of patterns forming a first continuous structure 1102, and a second set of patterns forming a second continuous structure 1122. The first continuous structure 1102 is configured to form a BM0 track (hereinafter "BM0 track 1102"); and the second continuous structure 1122 is configured to form a BM1 track (hereinafter "BM1 track 1122"). As shown, the BM0 track 1102 has a number of first portions (patterns) extending along the X direction (e.g., 1102B) and a number of second portions (patterns) extending along the Y direction (e.g., 1102A, 1102C), and the BM1 track 1122 has a number of first portions (patterns) extending along the X direction (e.g., 1122A, 1122C) and a number of second portions (patterns) extending along the Y direction (e.g., 1122B). Further, each of the first portions of the BM0 track 1102 (e.g., 1102B) has its two ends connected to a pair of the second portions of the BM0 track 1102 (e.g., 1102A and 1102C); and each of the second portions of the BM1 track 1122 (e.g., 1122B) has its two ends connected to a pair of the first portions of the BM1 track 1122 (e.g., 1122A and 1122C). Although a combination of the BM0 track 1102 and BM1 track 1122 is formed across the entire piece of the metal structure 440 (the fuse resistor) in the example of FIG. 11, it should be understood that the combination can be confined around a certain portion of the metal structure 440 (e.g., around a central portion of the metal structure 440) while remaining within the scope of the present disclosure. The BM0 track 1102 is electrically coupled to the BM1 track 1122 through a number of via structures (similar to via structures 550 of FIG. 5, which are not displayed in FIG. 11 for clarity). Accordingly, the BM0 track 1102 and BM1 track 1122 can collectively conduct a substantially high current to heat up the fuse resistor formed on the frontside.

Figure 12:
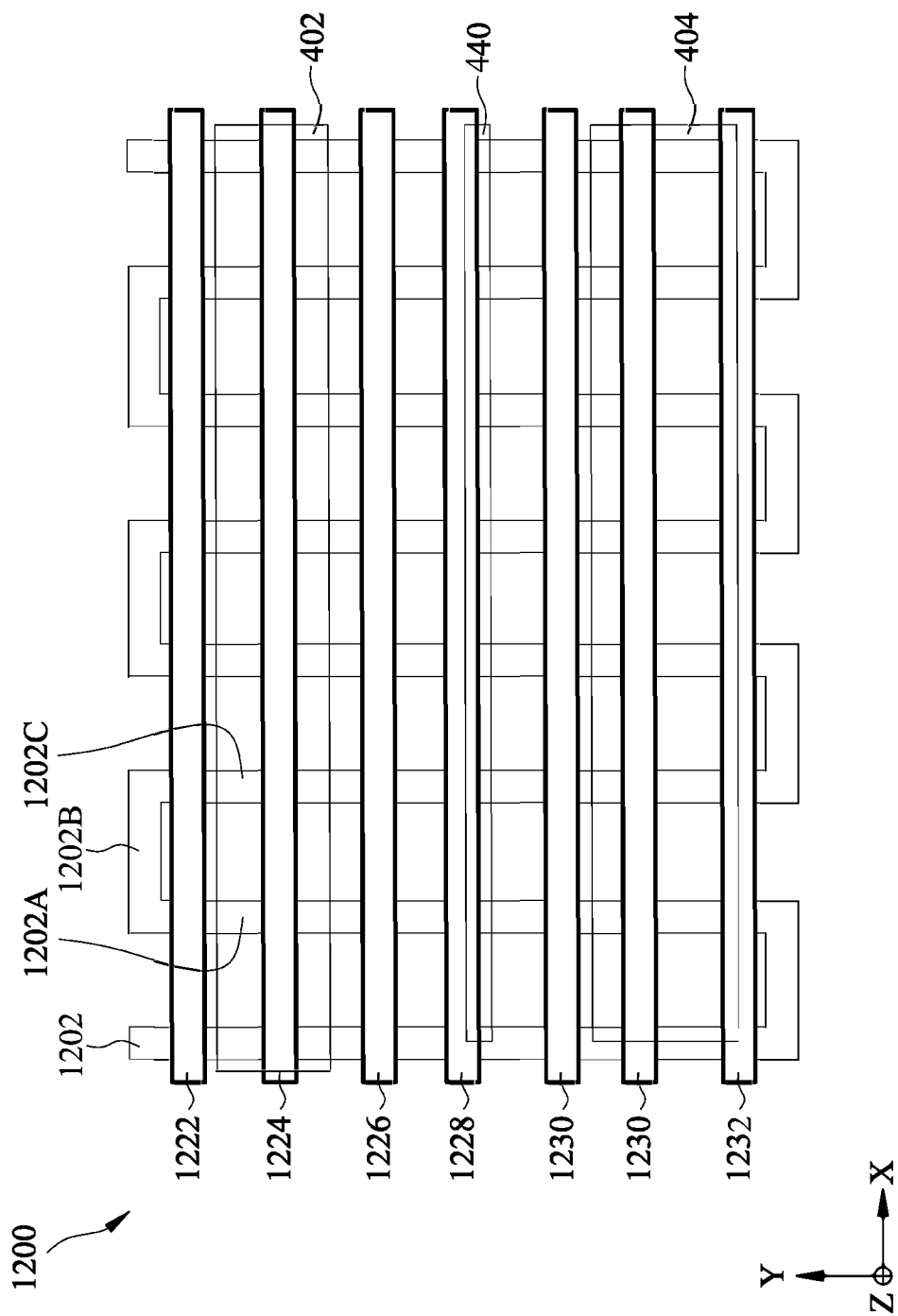

In FIG. 12, the layout 1200 includes a first set of patterns forming a first continuous structure 1202, and a second set of patterns, 1222, 1224, 1226, 1228, 1230, and 1232. The first continuous structure 1202 is configured to form a BM0 track (hereinafter "BM0 track 1202"); and the second set of patterns 1222 to 1232 are each configured to form a BM1 track (hereinafter "BM1 track 1222," "BM1 track 1224," "BM1 track 1226," "BM1 track 1228," "BM1 track 1230," and "BM1 track 1232," respectively). As shown, the BM0 track 1202 has a number of first portions (patterns) extending along the Y direction (e.g., 1202A, 1202C) and a number of second portions (patterns) extending along the X direction (e.g., 1202B), while the BM1 tracks 1222 to 1232 extend along the X direction. Further, each of the second portions of the BM0 track 1202 (e.g., 1202B) has its two ends connected to a pair of the first portions of the BM0 track 1202 (e.g., 1202A and 1202C). Although a combination of the BM0 track 1202 and BM1 track 1222 is formed across the entire piece of the metal structure 440 (the fuse resistor) in the example of FIG. 12, it should be understood that the combination can be confined around a certain portion of the metal structure 440 (e.g., around a central portion of the metal structure 440) while remaining within the scope of the present disclosure. The BM0 track 1202 is electrically coupled to the BM1 track 1222 through a number of via structures (similar to via structures 550 of FIG. 5, which are not displayed in FIG. 12 for clarity). Accordingly, the BM0 track 1202 and BM1 track 1222 can collectively conduct a substantially high current to heat up the fuse resistor formed on the frontside.

Figure 13:
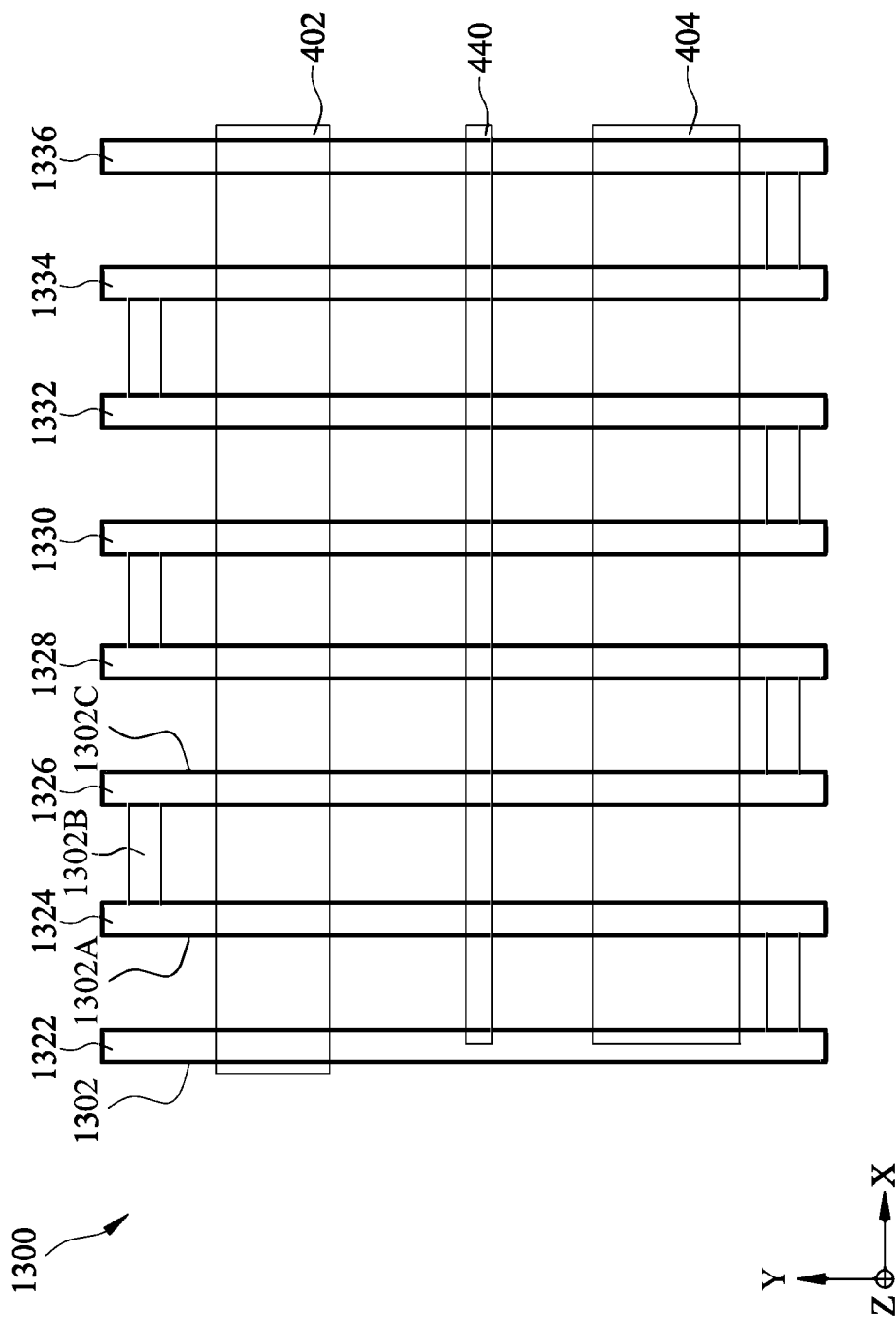

In FIG. 13, the layout 1300 includes a first set of patterns forming a first continuous structure 1302, and a second set of patterns, 1322, 1324, 1326, 1328, 1330, 1332, 1334, and 1336. The first continuous structure 1302 is configured to form a BM0 track (hereinafter "BM0 track 1302"); and the second set of patterns 1322 to 1336 are each configured to form a BM1 track (hereinafter "BM1 track 1322," "BM1 track 1324," "BM1 track 1326," "BM1 track 1328," "BM1 track 1330," "BM1 track 1332," "BM1 track 1334," and "BM1 track 1336," respectively). As shown, the BM0 track 1302 has a number of first portions (patterns) extending along the Y direction (e.g., 1302A, 1302C) and a number of second portions (patterns) extending along the X direction (e.g., 1302B), while the BM1 tracks 1322 to 1336 extend along the Y direction. Further, each of the second portions of the BM0 track 1302 (e.g., 1302B) has its two ends connected to a pair of the first portions of the BM0 track 1302 (e.g., 1302A and 1302C). Although a combination of the BM0 track 1302 and BM1 tracks 1322 to 1336 is formed across the entire piece of the metal structure 440 (the fuse resistor) in the example of FIG. 13, it should be understood that the combination can be confined around a certain portion of the metal structure 440 (e.g., around a central portion of the metal structure 440) while remaining within the scope of the present disclosure. The BM0 track 1302 is electrically coupled to the BM1 tracks 1322 to 1336 through a number of via structures (similar to via structures 550 of FIG. 5, which are not displayed in FIG. 13 for clarity). Accordingly, the BM0 track 1302 and BM1 tracks 1322 to 1336 can collectively conduct a substantially high current to heat up the fuse resistor formed on the frontside.

Figure 14:
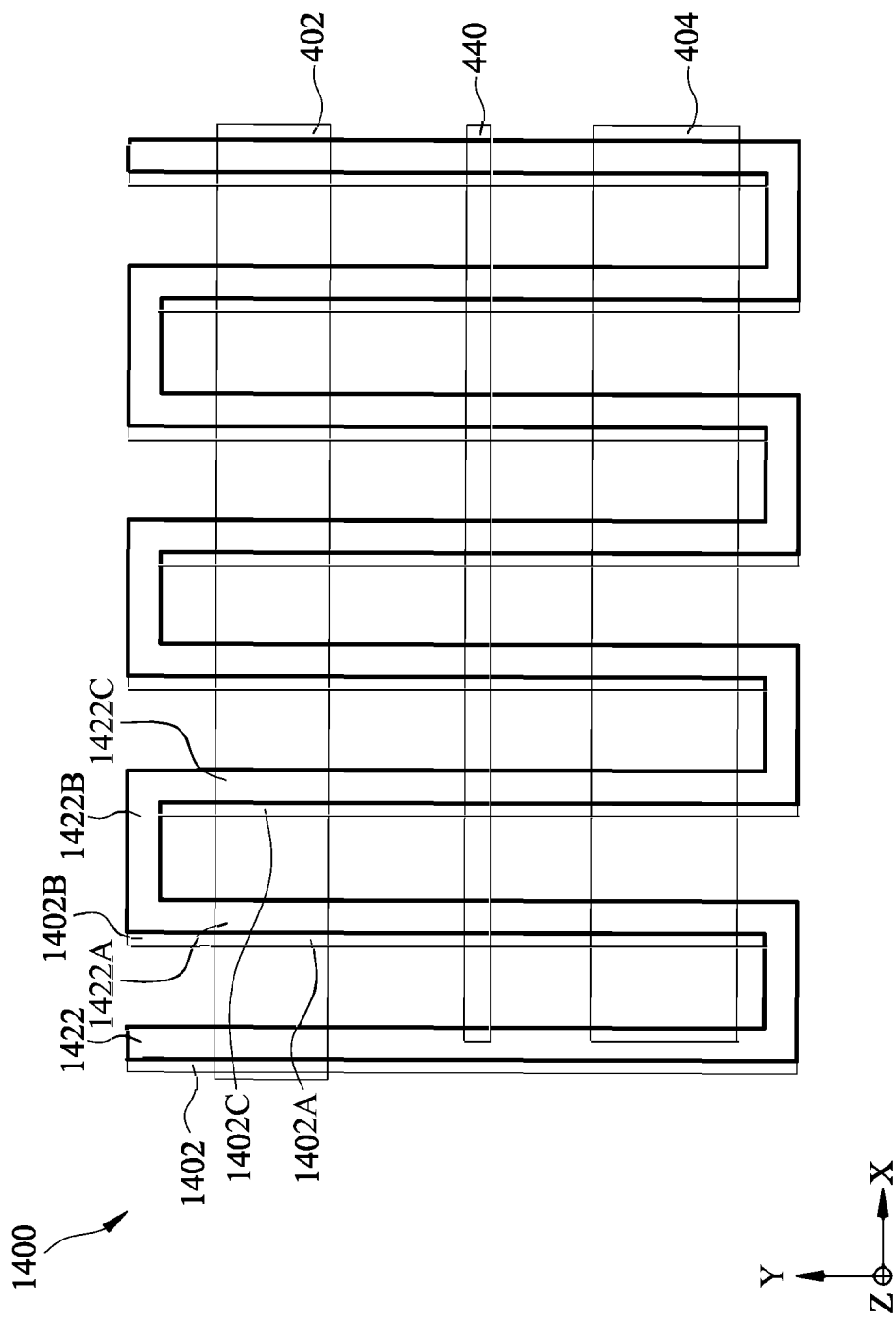

In FIG. 14, the layout 1400 includes a first set of patterns forming a first continuous structure 1402, and a second set of patterns forming a second continuous structure 1422. The first continuous structure 1402 is configured to form a BM0 track (hereinafter "BM0 track 1402"); and the second continuous structure 1422 is configured to form a BM1 track (hereinafter "BM1 track 1422"). As shown, the BM0 track 1402 has a number of first portions (patterns) extending along the Y direction (e.g., 1402A, 1402C) and a number of second portions (patterns) extending along the X direction (e.g., 1402B), and the BM1 track 1422 has a number of first portions (patterns) extending along the Y direction (e.g., 1422A, 1042€ 1422C) and a number of second portions (patterns) extending along the X direction (e.g., 1422B). Further, each of the second portions of the BM0 track 1402 (e.g., 1402B) has its two ends connected to a pair of the first portions of the BM0 track 1402 (e.g., 1402A and 1402C); and each of the second portions of the BM1 track 1422 (e.g., 1422B) has its two ends connected to a pair of the second portions of the BM1 track 1422 (e.g., 1422A and 1422C). In some embodiments, the BM0 track 1402 and BM1 track 1422 can be laterally aligned with each other. In some other embodiments, however, the BM0 track 1402 and BM1 track 1422 can be laterally offset from each other. Although a combination of the BM0 track 1402 and BM1 track 1422 is formed across the entire piece of the metal structure 440 (the fuse resistor) in the example of FIG. 14, it should be understood that the combination can be confined around a certain portion of the metal structure 440 (e.g., around a central portion of the metal structure 440) while remaining within the scope of the present disclosure. The BM0 track 1402 is electrically coupled to the BM1 track 1422 through a number of via structures (similar to via structures 550 of FIG. 5, which are not displayed in FIG. 14 for clarity). Accordingly, the BM0 track 1402 and BM1 track 1422 can collectively conduct a substantially high current to heat up the fuse resistor formed on the frontside.

To further improve the programming yield of the efuse memory cells, a number of dielectric islands can be formed on the frontside. In various embodiments, at least a first dielectric island and at least a second dielectric island can be laterally formed next to a metal structure (e.g., 351 of FIG. 3) configured as the fuse resistor of an efuse memory cell. Such dielectric islands can be formed on the lateral opposite sides of the metal structure. Alternatively stated, the dielectric islands may be formed in the same metallization layer (e.g., M2) as the metal structure. The dielectric islands can be formed of such as a material that does not quickly dissipate heat, for example, a metal oxide material (e.g., vanadium oxide ($VO_2$)). As such, when the metal structure (the fuse resistor) is being programmed, heat can be even more quickly built up within the metal structure, which can advantageously improve the programming yield.

FIGS. 15, 16, 17, and 18 illustrate various example frontside layouts 1500, 1600, 1700, and 1800, respectively, configured to form such dielectric islands next to the disclosed efuse memory cell (formed based on the frontside layout 400 of FIG. 4), in accordance with various embodiments. Thus, at least some of the reference numerals of FIG. 4 may be again used in each of the following discussion of the layouts 1500 to 1800.

In FIG. 15, the layout 1500 includes patterns 1510 and 1520 configured to form a first dielectric island and a second dielectric island (hereinafter "dielectric island 1510" and "dielectric island 1520," respectively. As shown, the dielectric island 1510 is disposed adjacent the metal structure 440 on one of its sides in the Y-direction, and the dielectric island 1520 is disposed adjacent the metal structure 440 on the other of its sides in the Y-direction. Further, a lateral distance ("D1") between any of the dielectric island 1510 or 1520 can be configured to be greater than a burn-out distance of the corresponding metal structure, for example, between about 20 nanometers (nm) and about 200 nm.

In FIG. 16, the layout 1600 includes patterns 1610, 1620, 1630, and 1640 configured to form a first dielectric island, a second dielectric island, a third dielectric island, and a fourth dielectric island (hereinafter "dielectric island 1610," "dielectric island 1620," "dielectric island 1630," and "dielectric island 1640," respectively. As shown, the dielectric islands 1610 and 1620 are disposed adjacent the metal structure 440 on one of its sides in the Y-direction, and the dielectric island 1630 and 1640 are disposed adjacent the metal structure 440 on the other of its sides in the Y-direction. Further, a lateral distance ("D1") between any of the dielectric islands 1610 to 1640 can be configured to be greater than a burn-out distance of the corresponding metal structure, for example, between about 20 nanometers (nm) and about 200 nm.

In FIG. 17, the layout 1700 includes patterns 1710, 1720, and 1730 configured to form a first dielectric island, a second dielectric island, and a third dielectric island (hereinafter "dielectric island 1710," "dielectric island 1720," and "dielectric island 1730," respectively). As shown, the dielectric islands 1710 and 1720 are disposed adjacent the metal structure 440 on one of its sides in the Y-direction, and the dielectric island 1730 is disposed adjacent the metal structure 440 on the other of its sides in the Y-direction. Further, a lateral distance ("D") between any of the dielectric islands 1710 to 1730 can be configured to be greater than a burn-out distance of the corresponding metal structure, for example, between about 20 nanometers (nm) and about 200 nm.

In FIG. 18, the layout 1800 includes patterns 1810, 1820, and 1830 configured to form a first dielectric island, a second dielectric island, and a third dielectric island (hereinafter "dielectric island 1810," "dielectric island 1820," and "dielectric island 1830," respectively). As shown, the dielectric islands 1810 and 1820 are disposed adjacent the metal structure 440 on one of its sides in the Y-direction, and the dielectric island 1830 is disposed adjacent the metal structure 440 on the other of its sides in the Y-direction. Further, a lateral distance ("D") between any of the dielectric islands 1810 to 1830 can be configured to be greater than a burn-out distance of the corresponding metal structure, for example, between about 20 nanometers (nm) and about 200 nm.

Figure 19:
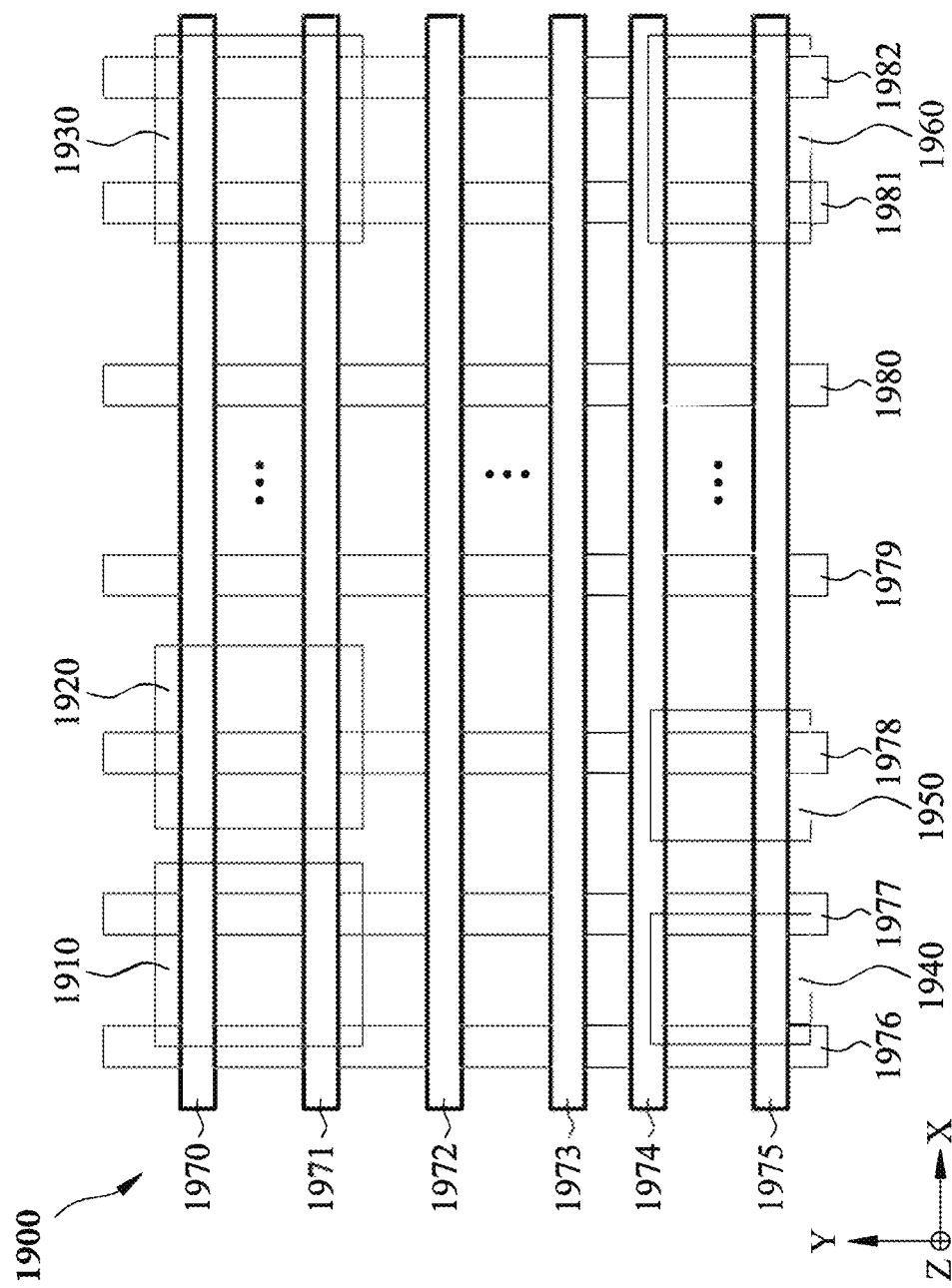
FIG. 19 illustrates a hybrid block and layout diagram of an array of memory cells of FIG. 3 sharing a common heater, in accordance with some embodiments.
Figure 20:
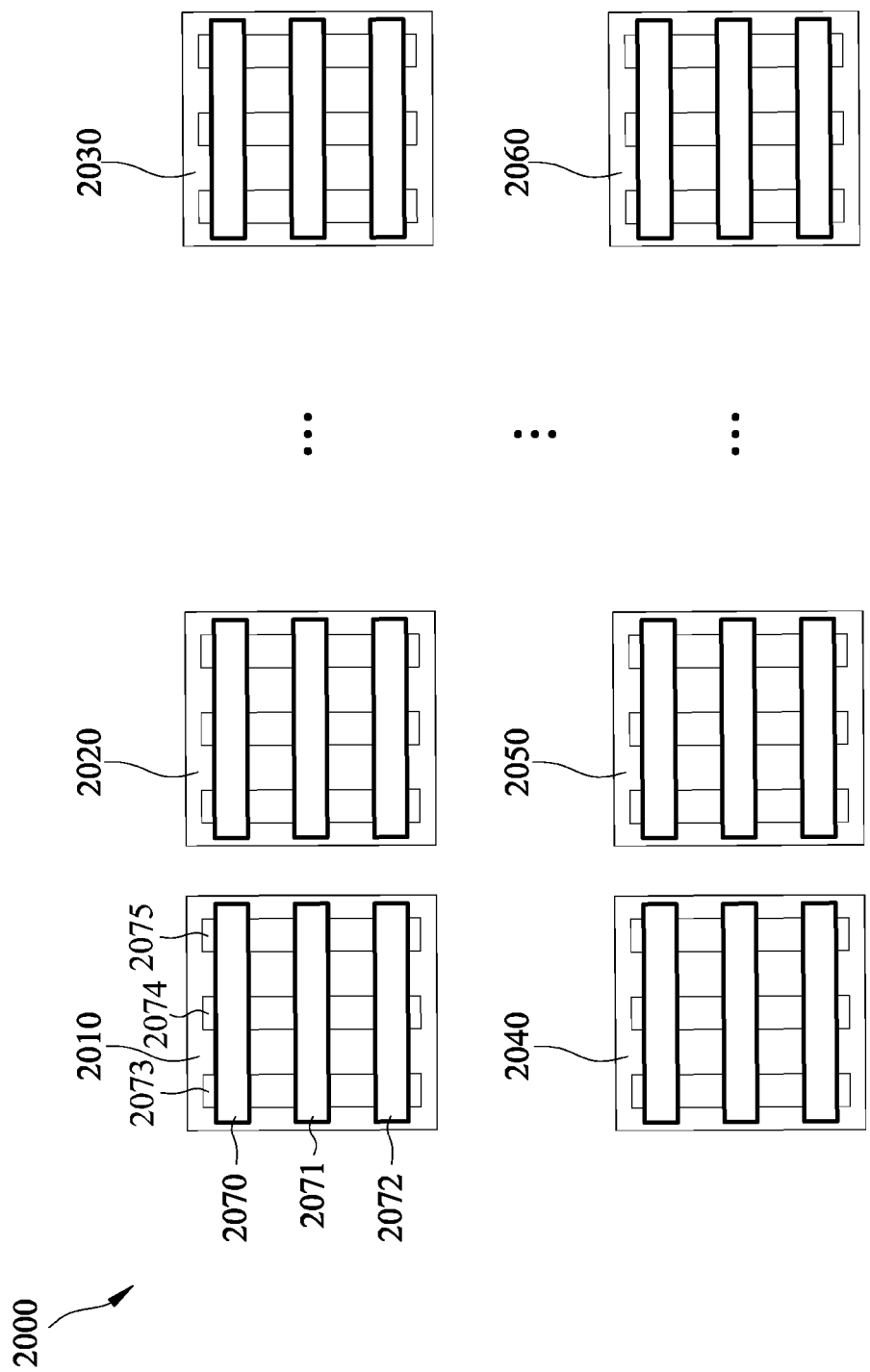
FIG. 20 illustrates a hybrid block and layout diagram of an array of memory cells of FIG. 3, each of which has a respective heater, in accordance with some embodiments.

In various embodiments, a memory array including a plural number of the disclosed efuse memory cells can be formed based on the layouts discussed above. For example in FIG. 19, a hybrid block and layout diagram 1900 showing a number of efuse memory cells 1910, 1920, 1930, 1940, 1950, and 1960 arranged as an array (having a number of columns and a number of row intersecting with one another), wherein each of the memory cells 1910 to 1960 can include the layout 400 (FIG. 4). These memory cells 1910 to 1960 can share a common heater formed based on the layout 500 (FIG. 5). In particular, the heater can include a first set of backside metal tracks (e.g., BM0 tracks) 1970, 1971, 1972, 1973, 1974, and 1975, and a second set of backside metal tracks (e.g., BM1 tracks) 1976, 1977, 1978, 1979, 1980, 1981, and 1982. For another example in FIG. 20, a hybrid block and layout diagram 2000 showing a number of efuse memory cells 2010, 2020, 2030, 2040, 2050, and 2060 arranged as an array (having a number of columns and a number of row intersecting with one another), wherein each of the memory cells 2010 to 2060 can include the layout 400 (FIG. 4). These memory cells 2010 to 2060 can each have a respective heater formed based on the layout 500 (FIG. 5). In particular, each of the heaters can include a first set of backside metal tracks (e.g., BM0 tracks) 2070, 2071, and 2072, and a second set of backside metal tracks (e.g., BM1 tracks) 2073, 2074, and 2075.

Figure 21:
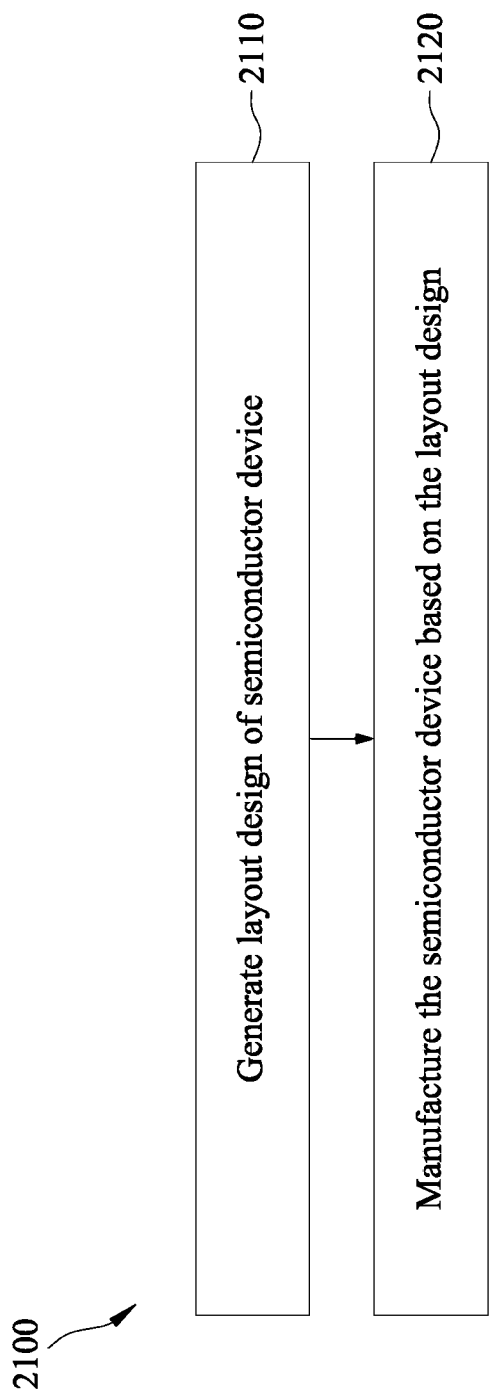
FIG. 21 illustrates a flowchart of a method of manufacturing a semiconductor device, in accordance with some embodiments.

FIG. 21 is a flowchart of a method 2100 of forming or manufacturing a semiconductor device, in accordance with some embodiments. It is understood that additional operations may be performed before, during, and/or after the method 2100 depicted in FIG. 21. In some embodiments, the method 2100 is usable to form a semiconductor device, according to various layouts (designs) as disclosed herein.

In operation 2110 of the method 2100, a layout design of a semiconductor device (e.g., a combination of the frontside layout 400 of FIG. 4 and any of the backside layouts 500 to 1400 of FIGS. 5 to 14) is generated. The operation 2110 is performed by a processing device (e.g., processor 2202 of FIG. 22) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system (GDSII) file format.

In operation 2120 of the method 2100, a semiconductor device is manufactured based on the layout design. In some embodiments, the operation 2120 of the method 2100 includes manufacturing at least one mask based on the layout design, and manufacturing the a semiconductor device based on the at least one mask. A number of example manufacturing operations of the operation 2120 will be discussed with respect to the method 2400 of FIG. 24 below.

Figure 22:
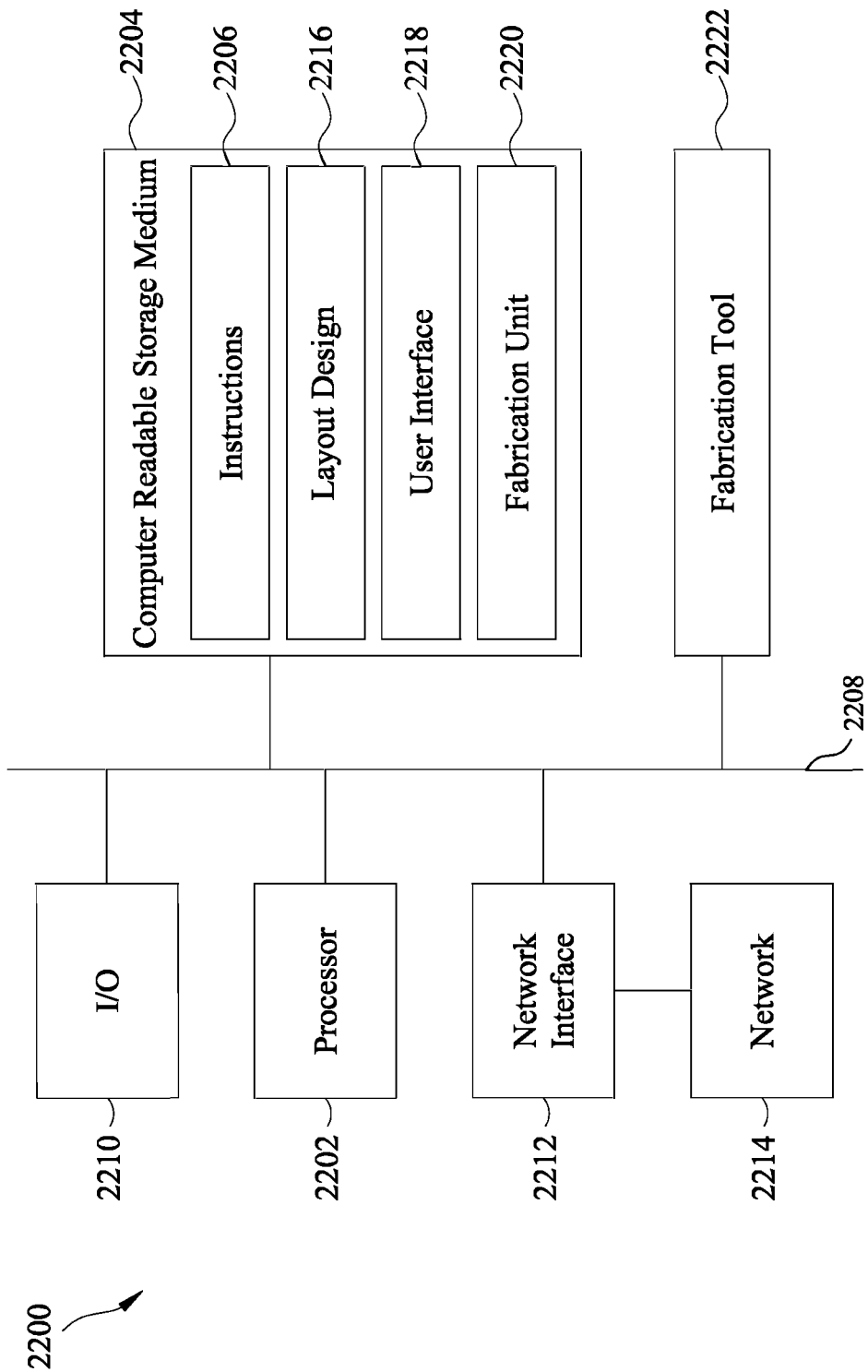
FIG. 22 illustrates a block diagram of a system of generating an IC layout design, in accordance with some embodiments.

FIG. 22 is a schematic view of a system 2200 for designing and manufacturing an IC layout design, in accordance with some embodiments. The system 2200 generates or places one or more IC layout designs, as described herein. In some embodiments, the system 2200 manufactures one or more semiconductor devices based on the one or more IC layout designs, as described herein. The system 2200 includes a hardware processor 2202 and a non-transitory, computer readable storage medium 2204 encoded with, e.g., storing, the computer program code 2206, e.g., a set of executable instructions. The computer readable storage medium 2204 is configured for interfacing with manufacturing machines for producing the semiconductor device. The processor 2202 is electrically coupled to the computer readable storage medium 2204 by a bus 2208. The processor 2202 is also electrically coupled to an I/O interface 2210 by the bus 2208. A network interface 2212 is also electrically connected to the processor 2202 by the bus 2208. Network interface 2212 is connected to a network 2214, so that the processor 2202 and the computer readable storage medium 2204 are capable of connecting to external elements via network 2214. The processor 2202 is configured to execute the computer program code 2206 encoded in the computer readable storage medium 2204 in order to cause the system 2200 to be usable for performing a portion or all of the operations as described in method 2100.

In some embodiments, the processor 2202 is a central processing unit (CPU), a multi-processor, a distributed processing system, an application specific integrated circuit (ASIC), and/or a suitable processing unit.

In some embodiments, the computer readable storage medium 2204 is an electronic, magnetic, optical, electromagnetic, infrared, and/or a semiconductor system (or apparatus or device). For example, the computer readable storage medium 2204 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2204 includes a compact disk-read only memory (CD-ROM), a compact disk-read/write (CD-R/W), and/or a digital video disc (DVD).

In some embodiments, the storage medium 2204 stores the computer program code 2206 configured to cause the system 2200 to perform the method 2100. In some embodiments, the storage medium 2204 also stores information needed for performing method 2100 as well as information generated during performance of method 2100, such as layout design 2216, user interface 2218, fabrication unit 2220, and/or a set of executable instructions to perform the operation of method 2100.

In some embodiments, the storage medium 2204 stores instructions (e.g., the computer program code 2206) for interfacing with manufacturing machines. The instructions (e.g., the computer program code 2206) enable the processor 2202 to generate manufacturing instructions readable by the manufacturing machines to effectively implement the method 2100 during a manufacturing process.

The system 2200 includes the I/O interface 2210. The I/O interface 2210 is coupled to external circuitry. In some embodiments, the I/O interface 2210 includes a keyboard, keypad, mouse, trackball, trackpad, and/or cursor direction keys for communicating information and commands to the processor 2202.

The system 2200 also includes the network interface 2212 coupled to the processor 2202. The network interface 2212 allows the system 2200 to communicate with the network 2214, to which one or more other computer systems are connected. The network interface 2212 includes wireless network interfaces such as BLUETOOTH, WIFI, WIMAX, GPRS, or WCDMA; or wired network interface such as ETHERNET, USB, or IEEE-13154. In some embodiments, the method 2100 is implemented in two or more systems 2200, and information such as layout design, user interface and fabrication unit are exchanged between different systems 2200 by the network 2214.

The system 2200 is configured to receive information related to a layout design through the I/O interface 2210 or network interface 2212. The information is transferred to the processor 2202 by the bus 2208 to determine a layout design for producing an IC. The layout design is then stored in the computer readable medium 2204 as the layout design 2216. The system 2200 is configured to receive information related to a user interface through the I/O interface 2210 or network interface 2212. The information is stored in the computer readable medium 2204 as the user interface 2218. The system 2200 is configured to receive information related to a fabrication unit through the I/O interface 2210 or network interface 2212. The information is stored in the computer readable medium 2204 as the fabrication unit 2220. In some embodiments, the fabrication unit 2220 includes fabrication information utilized by the system 2200.

In some embodiments, the method 2100 is implemented as a standalone software application for execution by a processor. In some embodiments, the method 2100 is implemented as a software application that is a part of an additional software application. In some embodiments, the method 2100 is implemented as a plug-in to a software application. In some embodiments, the method 2100 is implemented as a software application that is a portion of an EDA tool. In some embodiments, the method 2100 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, the method 2100 is implemented by a manufacturing device to manufacture an integrated circuit using a set of masks manufactured based on one or more layout designs generated by the system 2200. In some embodiments, the system 2200 includes a manufacturing device (e.g., fabrication tool 2222) to manufacture an integrated circuit using a set of masks manufactured based on one or more layout designs of the present disclosure. In some embodiments, the system 2200 of FIG. 22 generates layout designs of an IC that are smaller than other approaches. In some embodiments, the system 2200 of FIG. 22 generates layout designs of a semiconductor device that occupy less area than other approaches.

Figure 23:
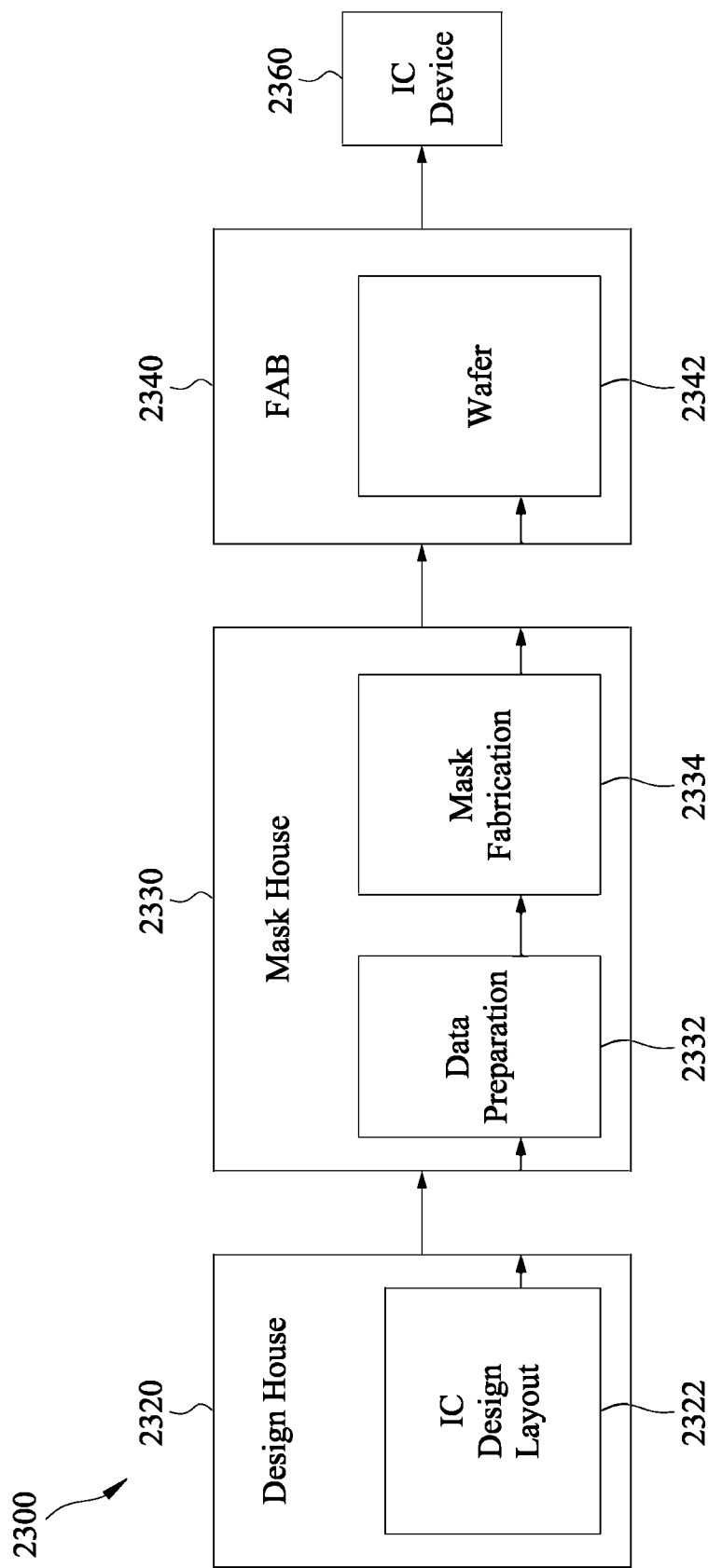
FIG. 23 illustrates a block diagram of an IC manufacturing system, and an IC manufacturing flow associated therewith, in accordance with some embodiments.

FIG. 23 is a block diagram of an integrated circuit (IC)/semiconductor device manufacturing system 2300, and an IC manufacturing flow associated therewith, in accordance with at least one embodiment of the present disclosure.

In FIG. 23, the IC manufacturing system 2300 includes entities, such as a design house 2320, a mask house 2330, and an IC manufacturer/fabricator ("fab") 2340, that interact with one another in the design, development, and manufacturing cycles and/or services related to manufacturing an IC device (semiconductor device) 2360. The entities in system 2300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2320, mask house 2330, and IC fab 2340 is owned by a single company. In some embodiments, two or more of design house 2320, mask house 2330, and IC fab 2340 coexist in a common facility and use common resources.

The design house (or design team) 2320 generates an IC design layout 2322. The IC design layout 2322 includes various geometrical patterns designed for the IC device 2360. The geometrical patterns correspond to patterns of metal, oxide, or semiconductor layers that make up the various components of the IC device 2360 to be fabricated. The various layers combine to form various IC features. For example, a portion of the IC design layout 2322 includes various IC features, such as an active region, gate structures, source/drain structures, interconnect structures, and openings for bonding pads, to be formed in a semiconductor substrate (such as a silicon wafer) and various material layers disposed on the semiconductor substrate. The design house 2320 implements a proper design procedure to form the IC design layout 2322. The design procedure includes one or more of logic design, physical design or place and route. The IC design layout 2322 is presented in one or more data files having information of the geometrical patterns. For example, the IC design layout 2322 can be expressed in a GDSII file format or DFII file format.

The mask house 2330 includes mask data preparation 2332 and mask fabrication 2334. The mask house 2330 uses the IC design layout 2322 to manufacture one or more masks to be used for fabricating the various layers of the IC device 2360 according to the IC design layout 2322. The mask house 2330 performs the mask data preparation 2332, where the IC design layout 2322 is translated into a representative data file ("RDF"). The mask data preparation 2332 provides the RDF to the mask fabrication 2334. The mask fabrication 2334 includes a mask writer. A mask writer converts the RDF to an image on a substrate, such as a mask (reticle) or a semiconductor wafer. The design layout is manipulated by the mask data preparation 2332 to comply with particular characteristics of the mask writer and/or requirements of the IC fab 2340. In FIG. 23, the mask data preparation 2332 and mask fabrication 2334 are illustrated as separate elements. In some embodiments, the mask data preparation 2332 and mask fabrication 2334 can be collectively referred to as mask data preparation.

In some embodiments, the mask data preparation 2332 includes optical proximity correction (OPC) which uses lithography enhancement techniques to compensate for image errors, such as those that can arise from diffraction, interference, other process effects and the like. OPC adjusts the IC design layout 2322. In some embodiments, the mask data preparation 2332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 2332 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during the mask fabrication 2334, which may undo part of the modifications performed by OPC in order to meet mask creation rules.

In some embodiments, the mask data preparation 2332 includes lithography process checking (LPC) that simulates processing that will be implemented by the IC fab 2340 to fabricate the IC device 2360. LPC simulates this processing based on the IC design layout 2322 to create a simulated manufactured device, such as the IC device 2360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the IC design layout 2322.

It should be understood that the above description of the mask data preparation 2332 has been simplified for the purposes of clarity. In some embodiments, the mask data preparation 2332 includes additional features such as a logic operation (LOP) to modify the IC design layout according to manufacturing rules. Additionally, the processes applied to the IC design layout 2322 during the mask data preparation 2332 may be executed in a variety of different orders.

After the mask data preparation 2332 and during mask fabrication 2334, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by the mask fabrication 2334 is used in a variety of processes. For example, such a mask(s) is used in an ion implantation process to form various doped regions in the semiconductor wafer, in an etching process to form various etching regions in the semiconductor wafer, and/or in other suitable processes.

The IC fab 2340 is an IC fabrication entity that includes one or more manufacturing facilities for the fabrication of a variety of different IC products. In some embodiments, the IC fab 2340 is a semiconductor foundry. For example, there may be a first manufacturing facility for the front end fabrication of a plurality of IC products (e.g., source/drain structures, gate structures), while a second manufacturing facility may provide the middle end fabrication for the interconnection of the IC products (e.g., MDs, VDs, VGs, etc.) and a third manufacturing facility may provide the back end fabrication for the interconnection and packaging of the IC products (e.g., M0 tracks, M1 tracks, BM0 tracks, BM1 tracks, etc.), and a fourth manufacturing facility may provide other services for the foundry entity.

The IC fab 2340 uses the mask (or masks) fabricated by the mask house 2330 to fabricate the IC device 2360. Thus, the IC fab 2340 at least indirectly uses the IC design layout 2322 to fabricate the IC device 2360. In some embodiments, a semiconductor wafer 2342 is fabricated by the IC fab 2340 using the mask (or masks) to form the IC device 2360. The semiconductor wafer 2342 includes a silicon substrate or other proper substrate having material layers formed thereon. Semiconductor wafer further includes one or more of various doped regions, dielectric features, multilevel interconnects, and the like (formed at subsequent manufacturing steps).

The system 2300 is shown as having the design house 2320, mask house 2330, and IC fab 2340 as separate components or entities. However, it should be understood that one or more of the design house 2320, mask house 2330 or IC fab 2340 are part of the same component or entity.

Figure 24:
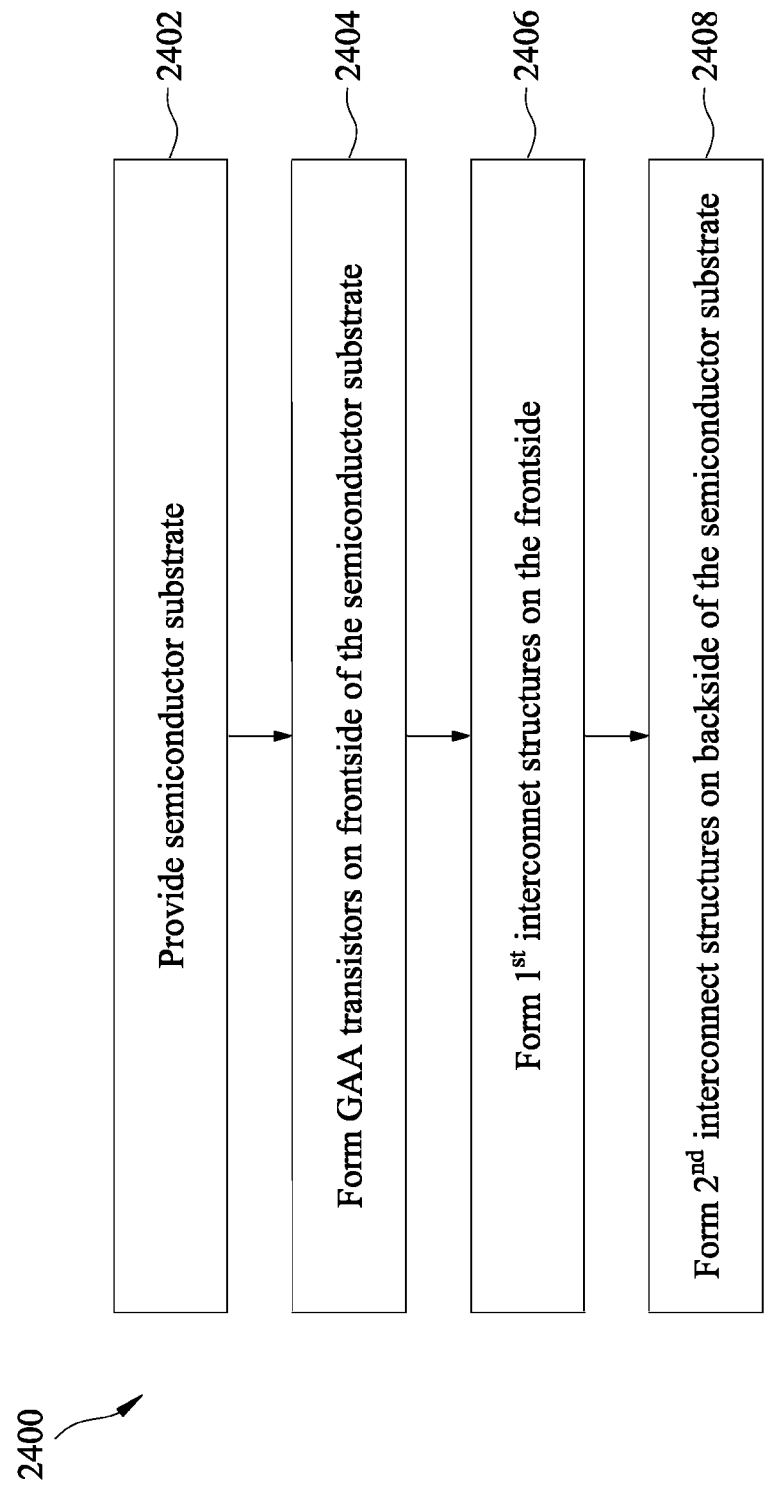
FIG. 24 illustrates a flow chart of an example method for making one or more memory cells on the frontside of a substrate that are thermally coupled with one or more heaters on the backside of the substrate, in accordance with some embodiments.

FIG. 24 is a flowchart illustrating an example method 2400 for fabricating a semiconductor device that includes the disclosed efuse memory cell (e.g., 310 of FIG. 3) and the heater (e.g., 360 of FIG. 3) thermally coupled to the efuse memory cell, according to various aspects of the present disclosure. The method 2400 may be part of the operation 2120 of the method 2100 (FIG. 21). As such, the semiconductor device may be made based on at least a portion of the layout design disclosed herein.

At least some operations of the method 2400 can be used to form a semiconductor device in a non-planar transistor configuration. For example, the semiconductor device may include one or more gate-all-around (GAA) transistors. However, it should be understood that the transistors of the semiconductor device may be each configured in any of various other types of transistors such as, for example, a CFET, while remaining within the scope of the present disclosure. It should be noted that the method 2400 is merely an example, and is not intended to limit the present disclosure. Accordingly, it should be understood that additional operations may be provided before, during, and/or after the method 2400, and that some other operations may only be briefly described herein. The following discussions of the method 2400 may refer to one or more components of FIGS. 1-23.

In brief overview, the method 2400 starts with operation 2402 of providing a semiconductor substrate. The method 2400 proceeds to operation 2404 of forming a number of GAA transistors on a frontside of the semiconductor substrate. The method 2400 proceeds to operation 2406 of forming a number of first interconnect structure on the frontside. The method 2400 proceeds to operation 2408 of forming a number of second interconnect structures on a backside of the semiconductor substrate.

In various embodiments, the GAA transistors and first interconnect structures may form a number of the disclosed efuse memory cells (e.g., an array of the efuse memory cells), and the second interconnect structures may form one or more of the disclosed heaters thermally coupled to the efuse memory cells. For example, a plural number of the efuse memory cells may be heated by a common heater. In another example, each of the efuse memory cells may be heated by a respective heater.

Corresponding to operation 2402, the semiconductor substrate may be a semiconductor substrate, such as a bulk semiconductor, a semiconductor-on-insulator (SOI) substrate, or the like, which may be doped (e.g., with a p-type or an n-type dopant) or undoped. The substrate may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Corresponding to operation 2404, on the frontside of the semiconductor substrate, a number of GAA transistors are formed. The GAA transistors may each be formed by at least some of the following process steps: forming a fin structure protruding from the substrate, wherein the fin structure includes a number of first semiconductor nanostructures and a number of second semiconductor nanostructures alternately stacked on top of one another; forming a dummy gate structure straddling the fin structure; forming gate spacers disposed along opposite sidewalls of the dummy gate structure; recessing portions of the fin structure that are not overlaid by the dummy gate structure (and the gate spacer); replacing respective end portions of each second semiconductor nanostructures with a dielectric material to form a number of inner spacers; forming source/drain structures in the fin structure that are disposed on opposite sides of the dummy gate structure; removing the dummy gate structure; removing the remaining second semiconductor nanostructures; and forming an active (e.g., metal) gate structure to wrap around each of the first semiconductor nanostructures. In some embodiments, the first semiconductor nanostructures may be collectively referred to as a channel of the GAA transistor, and the second semiconductor nanostructures being replaced with the active gate structure may be referred to as sacrificial nanostructures.

Corresponding to operation 2406, on the frontside of the semiconductor substrate, the first interconnect structures are formed. The first interconnect structures can include a number of middle-end-of-line (MEOL) interconnect structures (e.g., MDs, VDs, VGs), and a number of back-end-of-line (BEOL) interconnect structures (e.g., M0 tracks, VOs, M1 tracks, etc.), as described above. In some embodiments, the MEOL and BEOL interconnect structures can each extend along in a single direction. For example, the MDs may all extend along a first lateral direction in parallel with the gate structures; the M0 tracks may all extend along a second lateral direction perpendicular to the first lateral direction (in parallel with a lengthwise direction of the channel); and the M1 tracks may all extend along the first lateral direction. Each of the first interconnect structures disposed on the frontside can include one or more metal materials such as, for example, tungsten (W), copper (Cu), gold (Au), cobalt (Co), Ruthenium (Ru), or combinations thereof.

Corresponding to operation 2408, on the backside of the substrate, the second interconnect structures are formed. In some embodiments, the second interconnect structure may collectively function as a heater, some of which may extend along at least one of the first or second direction while some of which may extend along at least one of the first or second direction. The second interconnect structures may be formed by at least some of the following process steps: flipping the semiconductor substrate; thinning down the semiconductor substrate from the backside until bottom surfaces of the source/drain structures (or bottom surfaces of dielectric layers underlying the source/drain structures, which are formed prior to epitaxially growing the source/drain structures) are exposed; and forming the second interconnect structures (e.g., various BM0 tracks, BM1 tracks discussed above). Each of the second interconnect structures disposed on the backside can include one or more metal materials such as, for example, tungsten (W), copper (Cu), gold (Au), cobalt (Co), Ruthenium (Ru), or combinations thereof.

In one aspect of the present disclosure, a semiconductor device is disclosed. The semiconductor device includes a memory cell including a transistor and a resistor operatively coupled to each other in series, wherein the transistor and the resistor are formed on a frontside of a substrate. The semiconductor device includes a heater structure, disposed on a backside of the substrate opposite to the frontside, that includes a plurality of backside interconnect structures, wherein the heater structure is configured to elevate a temperature of the resistor when the memory cell is being programmed.

In another aspect of the present disclosure, a memory device is disclosed. The memory device includes a plurality of one-time-programmable (OTP) memory cells formed as a memory array. Each of the plurality of OTP memory cells includes a transistor and a metal structure electrically coupled to each other in series, and the plurality of OTP memory cells are formed on a first side of a substrate. The memory device includes a heater structure, disposed on a second side of the substrate opposite to the first side, that includes a plurality of interconnect structures. The plurality of interconnect structures are configured to conduct a substantially high current so as to elevate a temperature of the resistor when any of the OTP memory cells is being programmed.

In yet another aspect of the present disclosure, a method for fabricating a memory device is disclosed. The method includes forming, on a frontside of a substrate, a plurality of nanostructures extending along a first lateral direction. The method includes forming, on the frontside of the substrate, a gate structure extending along a second lateral direction and wrapping around each of the plurality of nanostructures. The method includes forming, on the frontside of the substrate, a metal structure extending along the first lateral direction and disposed above the gate structure, wherein the metal structure is electrically coupled to the plurality of nanostructures. The method includes forming, on a backside of the substrate, a plurality of first interconnect structures. The method includes forming, on the backside side of the substrate, a plurality of second interconnect structures electrically coupled to the plurality of first interconnect structures. The plurality of first interconnect structures and the plurality of second interconnect structures are electrically isolated from the metal structure but thermally coupled to the metal structure by conducting a substantially high current to heat the metal structure.

As used herein, the terms "about" and "approximately" generally mean plus or minus 10% of the stated value. For example, about 0.5 would include 0.45 to 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a memory cell including a transistor and a resistor operatively coupled to each other in series, wherein the transistor and the resistor are formed on a frontside of a substrate; and
a heater structure, disposed on a backside of the substrate opposite to the frontside, that includes a plurality of backside metal wiring levels patterned to form interconnect structures that are electrically isolated from but thermally coupled through the substrate to the resistor, wherein the heater structure is configured to elevate a temperature of the resistor when the memory cell is being programmed.

2. The semiconductor device of claim 1, wherein the memory cell includes an electrical fuse configured to be programmed once.

3. The semiconductor device of claim 1, wherein
the transistor includes:
a first channel structure; and
a first source structure and a first drain structure disposed on opposite sides of the first channel structure along a first lateral direction; and
the resistor includes at least a frontside interconnect structure extending along the first lateral direction and disposed above the first channel structure, the first source structure, and the first drain structure;
wherein the first channel structure, the first source structure, and the first drain structure are disposed in a first active region of the substrate that is offset from the frontside interconnect structure of the resistor along a second lateral direction perpendicular to the first lateral direction.

4. The semiconductor device of claim 3, wherein
the transistor further includes:
a second channel structure; and
a second source structure and a second drain structure disposed on opposite sides of the second channel structure along the first lateral direction;
wherein the second channel structure, the second source structure, and the second drain structure are disposed in a second active region of the substrate that is offset from the frontside interconnect structure of the resistor along the second lateral direction.

5. The semiconductor device of claim 3, further comprising:
a first dielectric island spaced apart from the frontside interconnect structure of the resistor; and
a second dielectric island spaced apart from the frontside interconnect structure of the resistor;
wherein the first dielectric island and the second dielectric island, formed of vanadium dioxide, are disposed on opposite sides of the frontside interconnect structure along the second lateral direction.

6. The semiconductor device of claim 1, wherein the plurality of backside interconnect structures include a first subset and a second subset electrically coupled to each other, and wherein the first subset of backside interconnect structures are disposed in a first level on the backside and the second subset of backside interconnect structures are disposed in a second, different level on the backside.

7. The semiconductor device of claim 6, wherein each of the first subset of backside interconnect structures extends along a first lateral direction, and each of the second subset of backside interconnect structures extends along a second lateral direction perpendicular to the first lateral direction.

8. The semiconductor device of claim 6, wherein the first subset of backside interconnect structures form a first continuous interconnect structure that has a plurality of first portions extending along a first lateral direction and a plurality of second portions extending along a second lateral direction perpendicular to the first lateral direction, and wherein each of the plurality of second portions of the first continuous interconnect structure has its two ends respectively connected to a corresponding pair of the plurality of first portions of the first continuous interconnect structure.

9. The semiconductor device of claim 8, wherein the second subset of backside interconnect structures form a second continuous interconnect structure that has a plurality of first portions extending along the first lateral direction and a plurality of second portions extending along the second lateral direction, and wherein each of the plurality of first portions of the second continuous interconnect structure has its two ends respectively connected to a corresponding pair of the plurality of second portions of the second continuous interconnect structure.

10. The semiconductor device of claim 8, wherein the first subset of backside interconnect structures all extend along the first lateral direction.

11. The semiconductor device of claim 8, wherein the second subset of backside interconnect structures all extend along the second lateral direction.

12. The semiconductor device of claim 8, wherein the second subset of backside interconnect structures form a second continuous interconnect structure that has a plurality of first portions extending along the first lateral direction and a plurality of second portions extending along the second lateral direction, and wherein each of the plurality of second portions of the second continuous interconnect structure has its two ends respectively connected to a corresponding pair of the plurality of first portions of the second continuous interconnect structure.

13. A memory device, comprising:
a plurality of one-time-programmable (OTP) memory cells formed as a memory array, wherein each of the plurality of OTP memory cells includes a transistor and a metal structure electrically coupled to each other in series, and the plurality of OTP memory cells are formed on a first side of a substrate; and
a heater structure, disposed on a second side of the substrate opposite to the first side, that includes a plurality of backside metal wiring levels patterned to form interconnect structures that are electrically isolated from but thermally coupled through the substrate to the resistor, wherein the plurality of interconnect structures are configured to conduct a substantially high current so as to elevate a temperature of the resistor when any of the OTP memory cells is being programmed.

14. The memory device of claim 13, wherein the plurality of interconnect structures include a first subset and a second subset electrically coupled to each other, and wherein the first subset of interconnect structures are disposed in a first level on the second side and the second subset of interconnect structures are disposed in a second, different level on the second side.

15. The memory device of claim 14, wherein each of the first subset of interconnect structures extends along a first lateral direction, and each of the second subset of interconnect structures extends along a second lateral direction perpendicular to the first lateral direction.

16. The memory device of claim 14, wherein the first subset of interconnect structures form a first continuous interconnect structure that has a plurality of first portions extending along a first lateral direction and a plurality of second portions extending along a second lateral direction perpendicular to the first lateral direction, and wherein each of the plurality of second portions of the first continuous interconnect structure has its two ends respectively connected to a corresponding pair of the plurality of first portions of the first continuous interconnect structure.

17. The memory device of claim 16, wherein the second subset of interconnect structures form a second continuous interconnect structure that has a plurality of first portions extending along the first lateral direction and a plurality of second portions extending along the second lateral direction, and wherein each of the plurality of first portions of the second continuous interconnect structure has its two ends respectively connected to a corresponding pair of the plurality of second portions of the second continuous interconnect structure.

18. The memory device of claim 16, wherein the second subset of interconnect structures form a second continuous interconnect structure that has a plurality of first portions extending along the first lateral direction and a plurality of second portions extending along the second lateral direction, and wherein each of the plurality of second portions of the second continuous interconnect structure has its two ends respectively connected to a corresponding pair of the plurality of first portions of the second continuous interconnect structure.

19. A method for fabricating a memory device, comprising:
  forming, on a frontside of a substrate, a plurality of nanostructures extending along a first lateral direction;
  forming, on the frontside of the substrate, a gate structure extending along a second lateral direction and wrapping around each of the plurality of nanostructures;
  forming, on the frontside of the substrate, a metal structure extending along the first lateral direction and disposed above the gate structure, wherein the metal structure is electrically coupled to the plurality of nanostructures;
  forming, on a backside of the substrate, a plurality of first metal wiring patterns in a first backside metallization level; and
  forming, on the backside side of the substrate, a plurality of second metal wiring patterns in a second backside metallization level different from the first backside metallization level; and
  interconnecting the first and second metal wiring patterns to form a heater structure that is electrically isolated from the metal structure but thermally coupled through the substrate to the metal structure, wherein the heater structure is configured to heat the metal structure by conducting current to heat the metal structure.

20. The method of claim 19, wherein the metal structure is configured to be burned down once, during which the current flows through the plurality of first metal wiring patterns and the plurality of second metal wiring patterns.

* * * * *